United States Patent
Shibayama

(10) Patent No.: US 8,253,450 B2
(45) Date of Patent: Aug. 28, 2012

(54) CLOCK SIGNAL FREQUENCY DIVIDING CIRCUIT AND METHOD

(75) Inventor: Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 110 days.

(21) Appl. No.: 12/920,270

(22) PCT Filed: Mar. 5, 2009

(86) PCT No.: PCT/JP2009/054150
§ 371 (c)(1),
(2), (4) Date: Aug. 30, 2010

(87) PCT Pub. No.: WO2009/116398
PCT Pub. Date: Sep. 24, 2009

(65) Prior Publication Data
US 2011/0187418 A1  Aug. 4, 2011

(30) Foreign Application Priority Data
Mar. 17, 2008 (JP) ................................ 2008-067460

(51) Int. Cl.
*H03K 21/00* (2006.01)
*H03K 23/00* (2006.01)
*H03K 25/00* (2006.01)
(52) U.S. Cl. ........................ 327/115; 327/117; 327/118
(58) Field of Classification Search ................. 327/115, 327/117, 118
See application file for complete search history.

(56) References Cited

U.S. PATENT DOCUMENTS

| 7,196,558 | B2* | 3/2007 | Miller, Jr. | 327/115 |
| 2008/0061855 | A1* | 3/2008 | Cha et al. | 327/291 |
| 2010/0052740 | A1* | 3/2010 | Shibayama et al. | 327/117 |
| 2010/0123487 | A1* | 5/2010 | Marton et al. | 327/115 |
| 2011/0187418 | A1* | 8/2011 | Shibayama | 327/115 |
| 2011/0193596 | A1* | 8/2011 | Shibayama | 327/115 |
| 2011/0222644 | A1* | 9/2011 | Shibayama | 377/48 |

FOREIGN PATENT DOCUMENTS

| JP | 63-151217 A | 6/1988 |
| JP | 09-046222 A | 2/1997 |
| JP | 2005-045507 A | 2/2005 |
| JP | 2006-148807 A | 6/2006 |

* cited by examiner

*Primary Examiner* — Lincoln Donovan
*Assistant Examiner* — Adam Houston
(74) *Attorney, Agent, or Firm* — Sughrue Mion, PLLC

(57) ABSTRACT

A mask circuit (10) masks the clock pulses of a clock S in accordance with an input mask signal (50), generating and outputting a clock B. A mask control circuit (20) generates a mask signal (50) which assigns mask timings to mask (M–N) clock pulses, to timings other than communication timings to perform data communication, out of the timings of M successive clock pulses of the clock S, based on communication timing information (30) indicating the communication timings of data communication that is performed with a circuit A by a circuit B using the clock B. The mask control circuit (20) then outputs the mask signal (50) to the mask circuit (10).

16 Claims, 16 Drawing Sheets

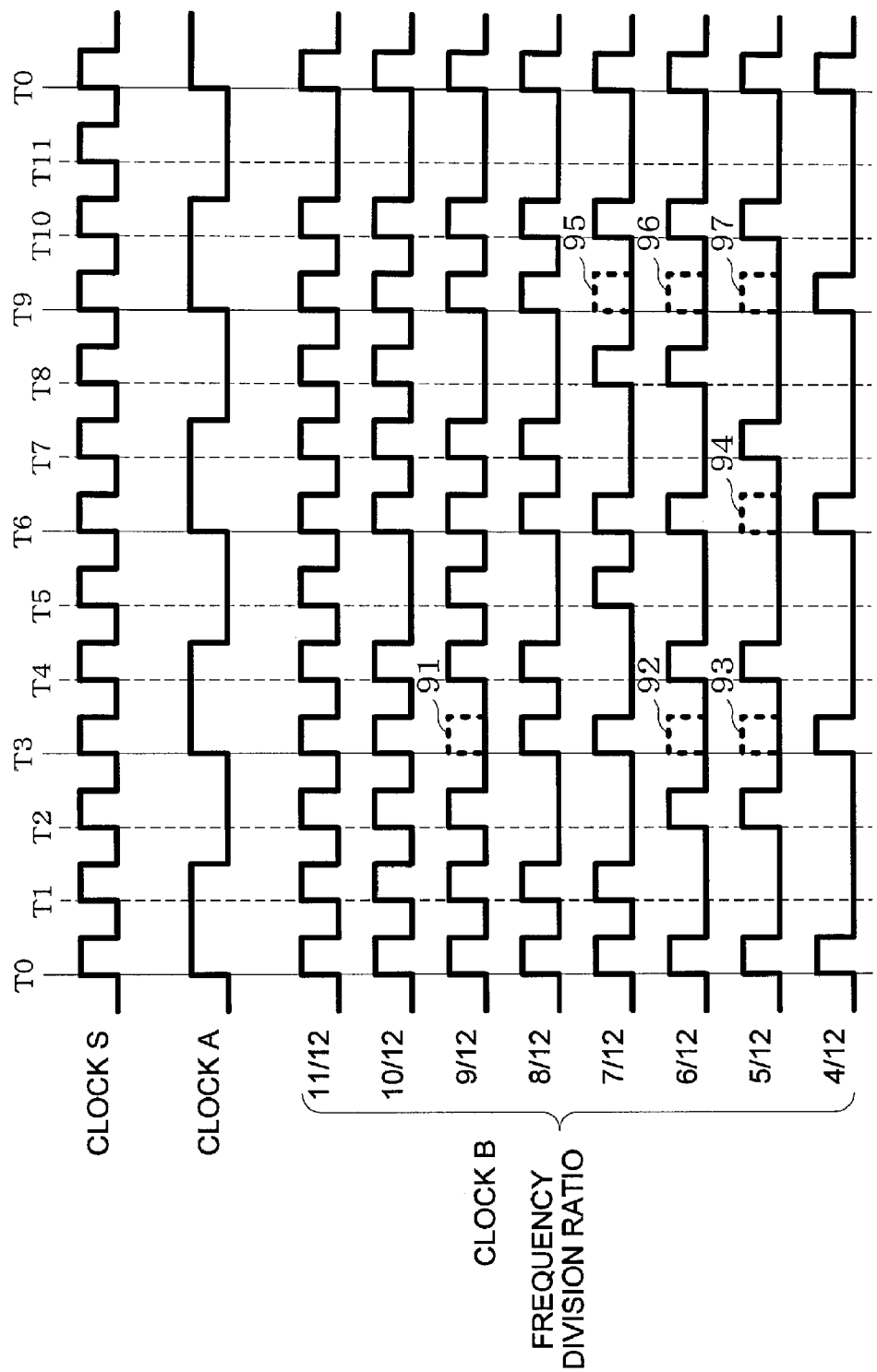

US 8,253,450 B2

CLOCK SIGNAL FREQUENCY DIVIDING CIRCUIT AND METHOD

CROSS REFERENCE TO RELATED APPLICATIONS

This application is a National Stage of International Application No. PCT/JP2009/054150, filed on Mar. 5, 2009, which claims priority from Japanese Patent Application No. 2008-067460, filed on Mar. 17, 2008, the contents of all of which are incorporated herein by reference in their entirety.

TECHNICAL FIELD

The present invention relates to a circuit technique and, more particularly, to a frequency dividing circuit technique of dividing a clock signal at a frequency division ratio of an arbitrary rational number.

BACKGROUND ART

In a clock signal frequency dividing circuit which divides the frequency of a clock signal having an arbitrary frequency to generate a clock signal having a lower frequency, a frequency dividing circuit (integer frequency dividing circuit) in which the frequency division ratio, i.e., the ratio of the frequencies of clock signals before and after the frequency division is 1/M (M is an integer) can be easily implemented using a counter.

There is proposed a frequency dividing circuit capable of dividing the frequency even at a frequency division ratio of a rational number given by N/M (N is a positive integer and M is a positive integer larger than N) (see, e.g., Japanese Patent Laid-Open Nos. 2005-45507 and 2006-148807). According to these related arts, the value N for setting the numerator of the frequency division ratio is accumulated in every cycle of an input clock signal. If the sum becomes larger than the value M for setting the denominator of the frequency division ratio, M is subtracted from the sum. By referring to the sum, the clock pulses of the input clock signal are appropriately masked (thinned), implementing rational number frequency division.

DISCLOSURE OF INVENTION

Problems to be Solved by the Invention

The clock signal frequency dividing circuits disclosed in Japanese Patent Laid-Open Nos. 2005-45507 and 2006-148807 generate an output clock signal by selectively masking the clock pulses of an input clock signal to divide its frequency. However, these clock signal frequency dividing circuits do not consider the communication timing of a partner circuit which performs data communication with a target circuit which uses the output clock signal.

For this reason, when the target circuit performs data communication with the partner circuit which operates based on a clock signal different in frequency from the input clock signal, a special clock converter and special timing design are required. This results in poor communication performance, large power consumption, large circuit scale, and high design cost.

A practical example of the problem experienced in the clock signal frequency dividing circuit of the related art will be explained with reference to FIGS. 15 and 16. FIG. 15 exemplifies a semiconductor integrated circuit using the clock signal frequency dividing circuit of the related art. FIG. 16 is a timing chart showing the operation of the clock signal frequency dividing circuit of the related art.

As shown in FIG. 15, the clock signal frequency dividing circuit generates a clock B by dividing a clock S by a rational number based on an input frequency division ratio setting. A circuit A (partner circuit) and circuit B (target circuit) communicate with each other using signals Aout and Bout. The signal Aout is output from the circuit A at the timing of the clock A, and input to the circuit B at the timing of the clock B. The signal Bout is output from the circuit B at the timing of the clock B, and input to the circuit A at the timing of the clock A.

FIG. 16 shows clocks B generated by dividing the frequency of the clock S at frequency division ratios of 11/12 to 4/12. The clock B can be generated by properly masking the clock pulses of the input clock S. For example, a clock B corresponding to a frequency division ratio of 9/12 is generated by masking three clock pulses at timings T3, T8, and T11 out of 12 clock pulses of the clock S at timings T0 to T11.

Assume that the frequency of the clock A is 1/3 of that of the clock S. That is, the frequency division ratio of the clock A to the clock S is 1/3 (=4/12). At this time, the phase relationship between the clocks A and B completes a cycle through 12 cycles of the clock S. T0 to T11 indicate the timings of the 12 cycles through which the phase relationship completes a cycle.

The circuits A and B communicate with each other at timings T0, T3, T6, and T9 which correspond to all the leading edges of the clock A. That is, the circuit A outputs the signal Aout and receives the signal Bout at timings T0, T3, T6, and T9 which correspond to the leading edges of the clock A and are communication timings.

However, the clock signal frequency dividing circuit of the related art does not consider communication of clocks having different frequencies. Thus, even at the communication timings, the clock pulses of the clock S may be masked to generate a clock B. In FIG. 16, the clock pulses of the clock S are masked at T3, T6, and T9, generating clocks B.

More specifically, the clock pulse is masked at timing T3 for frequency division ratios of 9/12 (91), 6/12 (92), and 5/12 (93). Similarly, the clock pulse is masked at timing T6 for a frequency division ratio of 5/12 (94). Also, the clock pulse is masked at timing T9 for frequency division ratios of 7/12 (95), 6/12 (96), and 5/12 (97).

When the clock B is generated by masking the clock pulses of the clock S at the communication timings, like the above cases, a signal output as the signal Aout from the circuit A which operates based on the clock A cannot be input to a timing expected by the circuit B which operates based on the clock B. Similarly, the circuit B which operates based on the clock B cannot output a signal to the signal Bout at a timing expected by the circuit A which operates based on the clock A.

To implement an expected correct communication operation in communication using clocks having different frequencies, the clock signal frequency dividing circuit of the related art requires a special clock converter and special timing design. This leads to poor communication performance, large power consumption, large circuit scale, and high design cost.

The present invention has been made to solve the above problems and has as its object to provide a clock signal frequency dividing circuit and method capable of generating an output clock signal which allows data communication even with a partner circuit that operates based on a clock signal different in frequency from an input clock signal, without degrading the communication performance.

Means of Solution to the Problems

To achieve the above object, according to the present invention, a clock signal frequency dividing circuit which masks (M–N) clock pulses out of M successive clock pulses of an input clock signal based on a frequency division ratio defined by N/M (N is a positive integer and M is a positive integer larger than N), thereby generating an output clock signal obtained by dividing a frequency of the input clock signal at N/M comprises a mask circuit which masks clock pulses of the input clock signal in accordance with an input mask signal, generating and outputting the output clock signal, and a mask control circuit which generates a mask signal that assigns mask timings to mask (M–N) clock pulses, to timings other than communication timings, out of timings of M successive clock pulses of the input clock signal, based on communication timing information indicating communication timings of data communication that is performed by a target circuit using the output clock signal, and which outputs the mask signal to the mask circuit.

According to the present invention, a clock signal frequency dividing method of generating an output clock signal obtained by dividing a frequency of an input clock signal at N/M based on a frequency division ratio defined by N/M (N is a positive integer and M is a positive integer larger than N) comprises a mask signal generation step of generating a mask signal that assigns mask timings to mask (M–N) clock pulses, to timings other than communication timings, out of timings of M successive clock pulses of the input clock signal, based on communication timing information indicating communication timings of data communication that is performed by a target circuit using the output clock signal, and a mask control step of generating and outputting the output clock signal by masking clock pulses of the input clock signal at the mask timings of the mask signal without masking clock pulses of the input clock signal at mask timings other than the mask timings.

Effects of the Invention

According to the present invention, the clock pulse of an input clock signal is not masked and is output as an output clock signal at the communication timing of a target circuit. The clock signal frequency dividing circuit can therefore generate an output clock signal which allows data communication even with a partner circuit that operates based on a clock signal different from the input clock signal, without degrading the communication performance.

This obviates the need for a special timing design and special clock converter for the purpose of communication using clock signals having different frequencies. The frequency of a clock signal can be divided by a rational number with low power, small area, and low design cost.

BRIEF DESCRIPTION OF DRAWINGS

FIG. 16 is a timing chart showing the operation of the clock signal frequency dividing circuit of the related art.

BEST MODE FOR CARRYING OUT THE INVENTION

Exemplary embodiments of the present invention will be described below with reference to the accompanying drawings.

First Exemplary Embodiment

Figure 1:
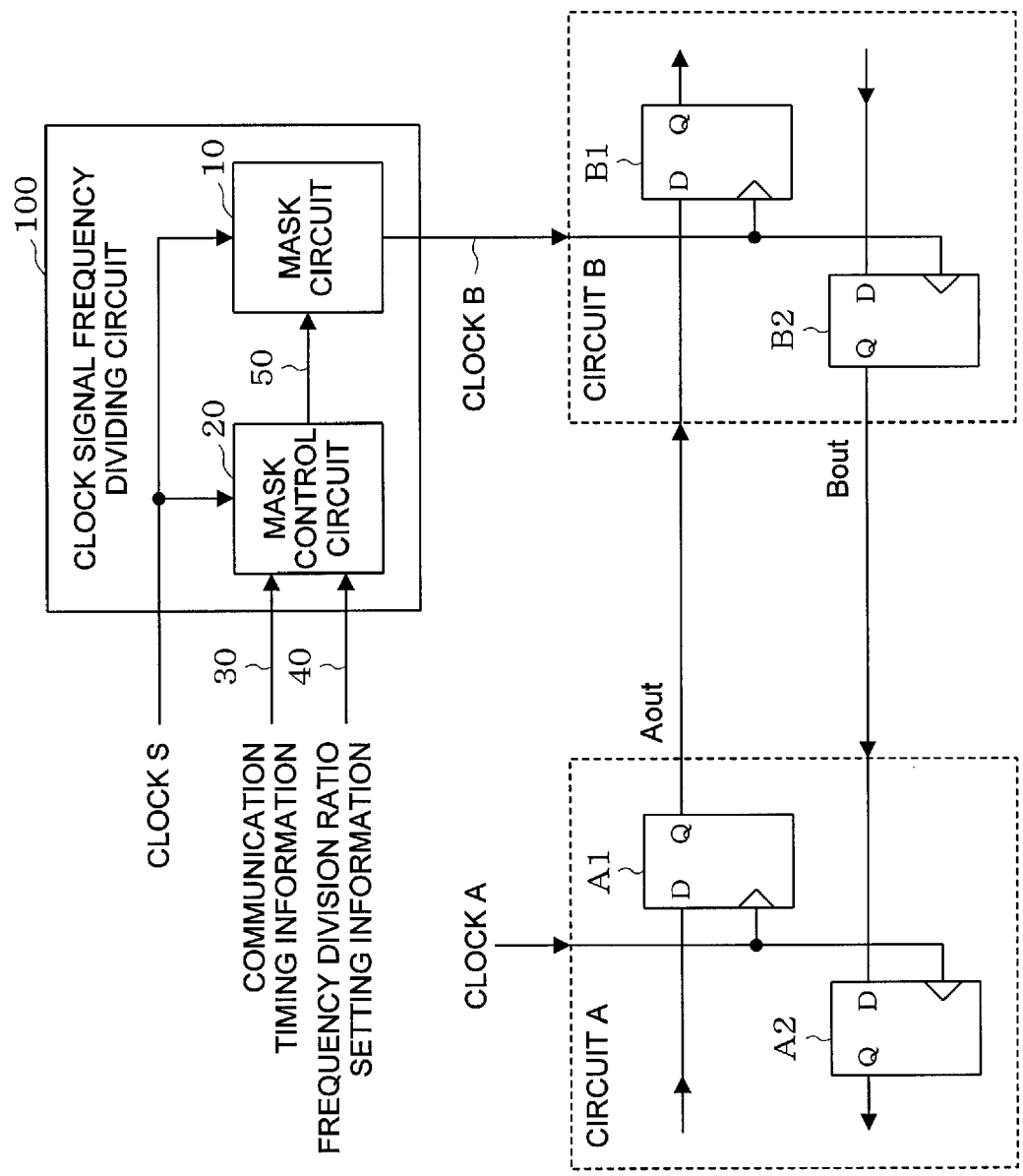
FIG. 1 is a block diagram showing the arrangement of a clock signal frequency dividing circuit according to the first exemplary embodiment of the present invention.

A clock signal frequency dividing circuit according to the first exemplary embodiment of the present invention will be described with reference to FIG. 1. FIG. 1 is a block diagram showing the arrangement of the clock signal frequency dividing circuit according to the first exemplary embodiment of the present invention.

FIG. 1 exemplifies a semiconductor integrated circuit including a circuit A (partner circuit) which operates based on a clock A, and a circuit B (target circuit) which operates based on a clock B. A clock signal frequency dividing circuit 100 according to the first exemplary embodiment is arranged for the circuit B.

The clock signal frequency dividing circuit 100 masks (M–N) clock pulses out of M successive clock pulses of a clock S (input clock signal) based on a frequency division ratio defined by N/M (N is a positive integer and M is a positive integer larger than N) of frequency division ratio setting information 40. As a result, the clock signal frequency dividing circuit 100 generates the clock B (output clock signal) obtained by dividing the frequency of the clock S at the frequency division ratio of N/M.

The clock signal frequency dividing circuit 100 includes a mask circuit 10 and mask control circuit 20 as main circuits.

The mask circuit 10 has a function of masking the clock pulses of the clock S in accordance with an input mask signal 50 to generate and output a clock B.

The mask control circuit 20 has a function of outputting, to the mask circuit 10, the mask signal 50 which assigns mask timings to mask (M−N) clock pulses, to timings other than the communication timings to perform data communication, out of the timings of M successive clock pulses of the clock S, based on communication timing information 30 indicating the communication timings of data communication which is performed with the circuit A by the circuit B using the clock B.

In addition to the frequency division ratio setting, the clock signal frequency dividing circuit 100 receives the communication timing information 30 indicating communication timings in the circuit B. Based on the communication timing information 30, the clock signal frequency dividing circuit 100 divides the frequency of the clock S at the frequency division ratio of the rational number N/M, generating a clock B.

The circuits A and B communicate with each other using signals Aout and Bout at the communication timings based on the communication timing information 30. In this example, the circuit A drives a latch circuit A1 at the leading edge of the clock A, outputting the signal Aout. The circuit B drives a latch circuit B1 at the leading edge of the clock B, receiving the signal Aout. Also, the circuit B drives a latch circuit B2 at the leading edge of the clock B, outputting the signal Bout. The circuit A drives a latch circuit A2 at the leading edge of the clock A, receiving the signal Bout.

Note that the clock S, clock A, communication timing information 30, and frequency division ratio setting information 40 are supplied from a host circuit (not shown).

Operation in First Exemplary Embodiment

Figure 2:
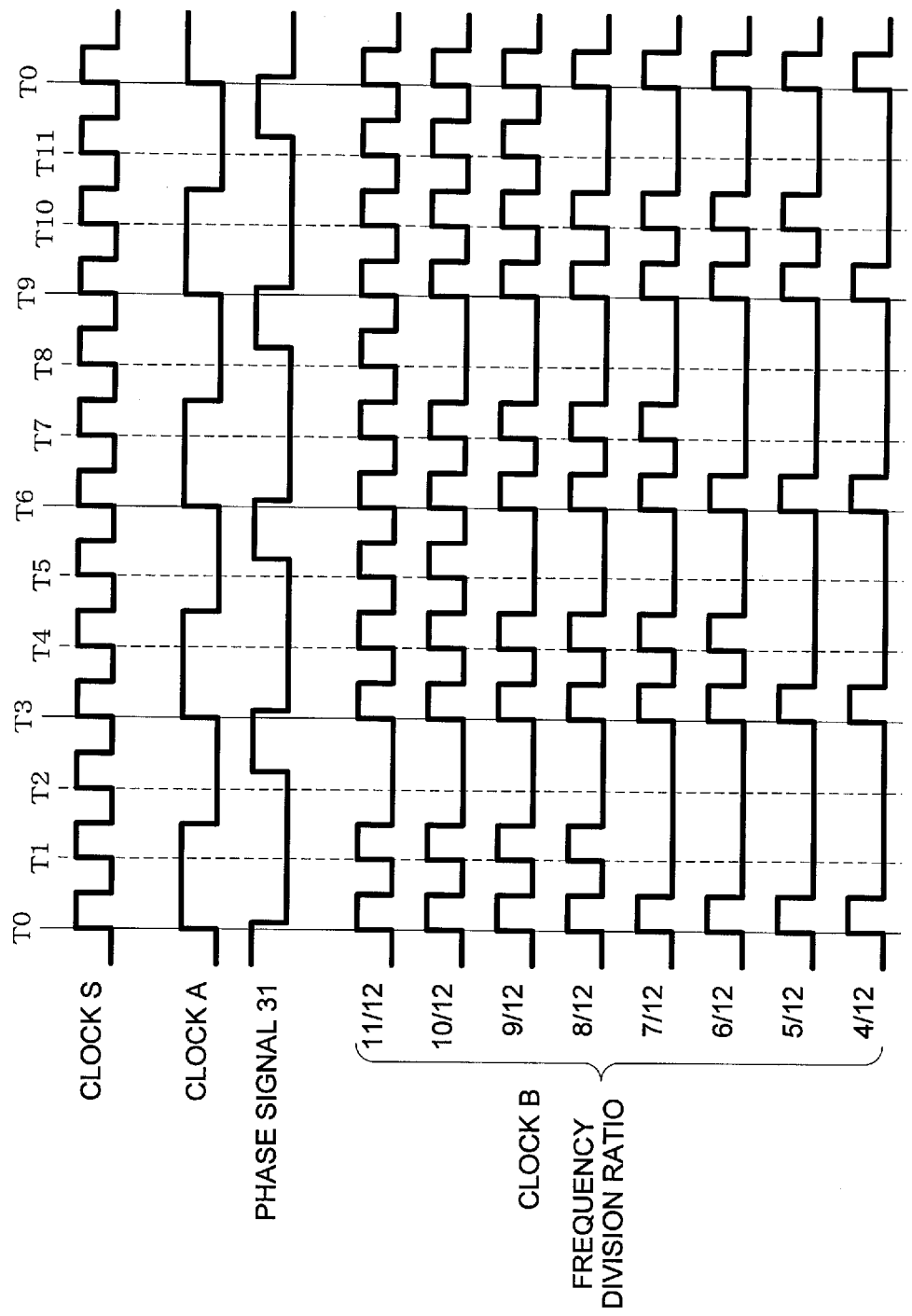
FIG. 2 is a timing chart showing the operation of the clock signal frequency dividing circuit according to the first exemplary embodiment of the present invention.

The operation of the clock signal frequency dividing circuit according to the first exemplary embodiment of the present invention will be described with reference to FIG. 2. FIG. 2 is a timing chart showing the operation of the clock signal frequency dividing circuit according to the first exemplary embodiment of the present invention. In this example, the frequency division ratio denominator M=12, the frequency division ratio numerator N=11 to 4, and the frequency of the clock S is divided at frequency division ratios of 11/12 to 4/12, generating clocks B.

The clock signal frequency dividing circuit 100 receives the clock S, a phase signal 31, and the frequency division ratio setting information 40 indicating the frequency division ratio N/M with respect to the clock S.

The clock S is a signal formed from successive clock pulses having a predetermined frequency. The phase signal 31 is an example of the communication timing information 30 indicating a phase at the communication timing in the circuit B. The phase signal 31 may be a signal indicating "1" at the communication timing to perform data communication in the circuit B, and "0" in the remaining period, as shown in FIG. 2. The frequency division ratio setting information 40 is formed from parallel data of several bits indicating the values of the frequency division ratio denominator M and frequency division ratio numerator N. The value of the frequency division ratio setting information 40 does not change unless the frequency division ratio changes.

Based on the communication timing information 30 and frequency division ratio setting information 40 of the circuit B, the mask control circuit 20 of the clock signal frequency dividing circuit 100 outputs, to the mask circuit 10, the mask signal 50 which assigns mask timings to mask (M−N) clock pulses, to timings other than the communication timings to perform data communication in the circuit B.

When data communication is done at the leading edge of the clock A in the circuit A, as described above, the phase signal 31 exhibits "1" at preceding and succeeding timings including the leading edge, and this leading edge serves as the communication timing of the circuit A. The mask control circuit 20 assigns mask timings to mask the clock pulses of the clock S, to timings other than the communication timings, i.e., timings when the phase signal 31 exhibits "0".

In FIG. 2, the clock A is synchronized with the clock S when the frequency of the clock A is 1/3 of that of the clock S, i.e., the frequency division ratio of the clock A to the clock S is 1/3 (=4/12). At this time, the phase relationship between the clocks A and B completes a cycle through 12 cycles of the clock S. In FIG. 2, T0 to T11 indicate the timings of the 12 cycles through which the phase relationship completes a cycle. The circuits A and B perform data communication at timings T0, T3, T6, and T9 which correspond to the leading edges of the clock A. The phase signal 31 changes to "1" at preceding and succeeding timings including timings T0, T3, T6, and T9.

Hence, the mask control circuit 20 generates the mask signal 50 which assigns mask timings to mask (M−N) clock pulses, to the leading edges of the clock pulses of the clock S in periods when the phase signal 31 indicates "0", i.e., to some of timings T1, T2, T4, T5, T7, T8, T10, and T11.

For example, when a mask timing is assigned to timing T2 among timings other than timings T0, T3, T6, and T9 out of 12 clock pulses of the clock S at timings T0 to T11, a clock B corresponding to a frequency division ratio of 11/12 can be generated. By additionally assigning a mask timing to T8, a clock B corresponding to a frequency division ratio of 10/12 can be generated. By additionally assigning a mask timing to T5, a clock B corresponding to a frequency division ratio of 9/12 can be generated. By additionally assigning a mask timing to T11, a clock B corresponding to a frequency division ratio of 8/12 can be generated.

Also, when mask timings are assigned to T1, T2, T5, T8, and T11 among timings other than T0, T3, T6, and T9, a clock B corresponding to a frequency division ratio of 7/12 can be generated. By additionally assigning a mask timing to T7, a clock B corresponding to a frequency division ratio of 6/12 can be generated. By additionally assigning a mask timing to T4, a clock B corresponding to a frequency division ratio of 5/12 can be generated. By additionally assigning a mask timing to T10, a clock B corresponding to a frequency division ratio of 4/12 can be generated.

Effects of First Exemplary Embodiment

As described above, in the first exemplary embodiment, the mask control circuit 20 generates the mask signal 50 which assigns mask timings to mask (M−N) clock pulses, to timings other than the communication timings to perform data communication in the circuit A (partner circuit), based on the communication timing information 30 indicating the communication timings of data communication which is performed in the circuit B (target circuit) using the clock B. The mask control circuit 20 then outputs the mask signal 50 to the mask circuit 10.

At timings other than the communication timings to perform data communication in the circuit B, (M−N) clock pulses of the clock S are masked, generating a clock B.

Thus, no clock pulse of the clock S is masked at the communication timing in the circuit B, and a clock pulse is always output as the clock B at the communication timing in the circuit B. In response to this, the circuit B can receive a signal output to the signal Aout from the circuit A at an expected timing. Similarly, the circuit B can output a signal to the signal Bout at a timing expected by the circuit A.

The clock signal frequency dividing circuit according to the first exemplary embodiment can therefore generate an output clock signal (clock B) which allows data communication even with a partner circuit (circuit A) that operates based on a clock signal (clock A) having a different frequency, without degrading the communication performance.

This obviates the need for a special timing design and special clock converter for the purpose of communication using clock signals having different frequencies. The frequency of a clock signal can be divided by a rational number with low power, small area, and low design cost.

According to the first exemplary embodiment, in accordance with the frequency division ratio setting information 40, the mask control circuit 20 assigns mask timings to mask (M–N) clock pulses, to timings other than the communication timings to perform data communication in a partner circuit. For example, even when the frequency division ratio N/M is changed to one of 11/12 to 4/12, the clock S can be masked at timings other than communication timings T0, T3, T6, and T9 in the circuit B. Even when the frequency division ratio is changed, neither the clock A nor communication timing of the circuit A need be changed, and the changed frequency division ratio can be coped with very flexibly.

In the first exemplary embodiment, the phase signal 31 indicating the communication timing of a target circuit (circuit B) is used as the communication timing information 30. Alternatively, a phase signal indicating the communication timing of a partner circuit (circuit A) is also usable. Even if the communication timings of the partner circuit are smaller in number than those of the target circuit, a clock B considering the communication timings of the circuit A can be generated automatically. Hence, the communication timings of the target circuit can be synchronized with those of even a partner circuit whose communicable timings are different from those of the target circuit.

Second Exemplary Embodiment

Figure 3:
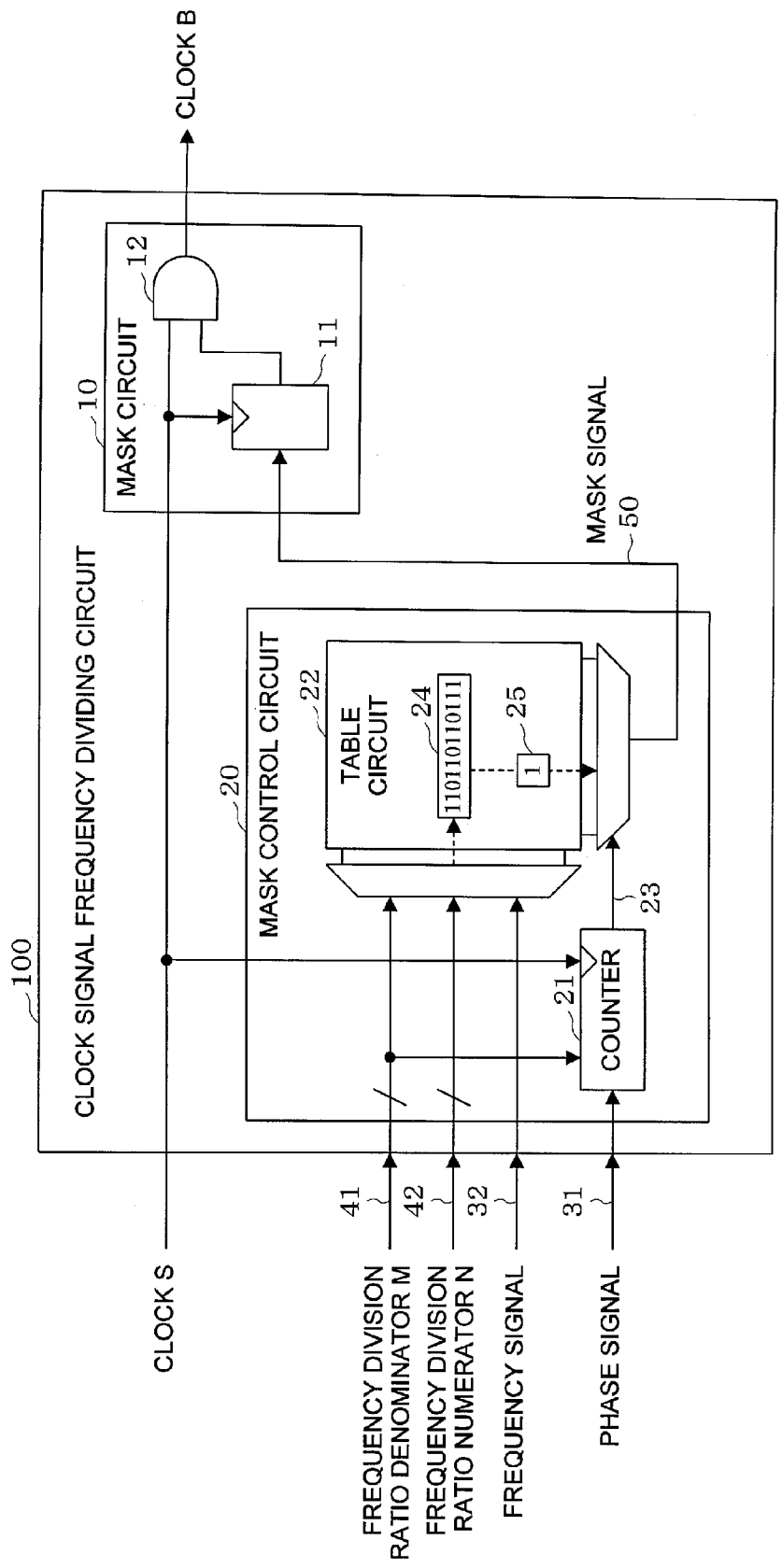
FIG. 3 is a block diagram showing the arrangement of a clock signal frequency dividing circuit according to the second exemplary embodiment of the present invention.

A clock signal frequency dividing circuit according to the second exemplary embodiment of the present invention will be described with reference to FIG. 3. FIG. 3 is a block diagram showing the arrangement of the clock signal frequency dividing circuit according to the second exemplary embodiment of the present invention.

The second exemplary embodiment will explain a practical example of the mask circuit 10 and mask control circuit 20 in the clock signal frequency dividing circuit 100 according to the first exemplary embodiment.

In FIG. 3, the mask circuit 10 has a function of referring to an input mask signal 50 to select whether to mask the pulse of a clock S or directly output it to a clock B without masking it.

In the second exemplary embodiment, the mask circuit 10 includes a latch circuit 11 and gate circuit 12.

The latch circuit 11 has a function of latching the mask signal 50 at the trailing edge of the clock S to limit the transition of the mask signal 50 input to the gate circuit 12 to the timing when the value of the clock S is "0".

The gate circuit 12 has a function of masking the clock S based on the mask signal 50 latched by the latch circuit 11. The gate circuit 12 masks the clock S when the value of the mask signal 50 is "0", and does not mask it when the value of the mask signal 50 is "1".

Arranging the latch circuit 11 can suppress generation of a glitch in the clock B. The latch circuit 11 has an effect of facilitating the timing design. However, if generation of a glitch is prevented by a strict timing design, the latch circuit 11 may be omitted. In FIG. 3, an AND circuit is used as the gate circuit 12 which masks the clock S, but the present invention is not limited to this. An OR circuit may be used, or a circuit having an equivalent function may be used.

The mask control circuit 20 has the following function. That is, the mask control circuit 20 counts the clock pulses of the clock S based on communication timing information 30 and frequency division ratio setting information 40, generating a count value indicating a relative phase at the communication timing in a circuit B with respect to the clock S. Based on the count value, the mask control circuit 20 generates and outputs the mask signal 50 which assigns mask timings.

In the second exemplary embodiment, the mask control circuit 20 includes a counter 21 and table circuit 22. The communication timing information 30 is made up of a frequency signal 32 indicating the frequency of a clock A used in a communication operation in a circuit A, and a phase signal 31 indicating a phase at the communication timing in the circuit A. Note that the frequency signal 32 is formed from parallel data of several bits indicating a value for specifying the clock A. The value of the frequency signal 32 does not change unless the clock A changes. The frequency division ratio setting information 40 is made up of the frequency division ratio denominator M and frequency division ratio numerator N which are parallel bit data of a plurality of bits.

The counter 21 has a function of counting the clock pulses of the clock S. When a count value 23 reaches the frequency division ratio denominator M, the counter 21 resets the count value in synchronism with a communication timing indicated by the phase signal 31, and outputs the count value 23 indicating a relative phase at the communication timing in the circuit A with respect to the clock S. The counter 21 outputs, as the count value 23, the number of cycles through which the phase relationship between the clocks A and B completes a cycle.

The table circuit 22 has a function of holding in advance, in a table form, table data 25 representing whether masking is necessary, for each combination 24 of the count value 23, the frequency signal 32 serving as the communication timing information 30, and a frequency division ratio denominator M (41) and frequency division ratio numerator N (42) serving as the frequency division ratio setting information 40. The table circuit 22 also has a function of outputting, as the mask signal 50, table data corresponding to a combination of these input values. In accordance with the frequency division ratio denominator M, frequency division ratio numerator N, frequency signal 32, and count value 23, the table circuit 22 outputs the mask signal 50 for each clock pulse of the clock S to control whether to mask the clock pulse of the clock S by the mask circuit 10.

Operation in Second Exemplary Embodiment

Figure 4:
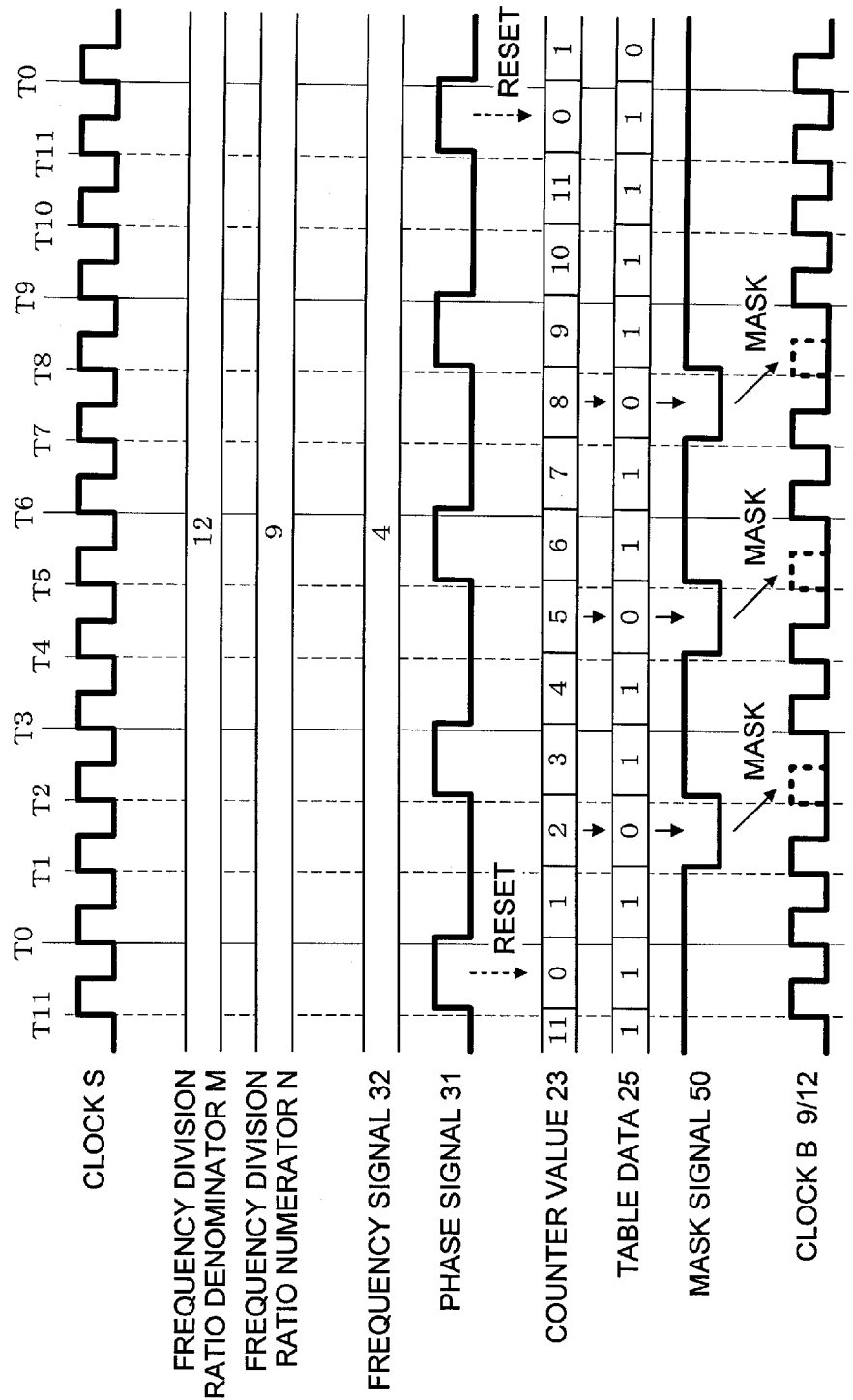
FIG. 4 is a timing chart showing the operation of the clock signal frequency dividing circuit according to the second exemplary embodiment of the present invention.

The operation of the clock signal frequency dividing circuit according to the second exemplary embodiment of the present invention will be described with reference to FIG. 4. FIG. 4 is a timing chart showing the operation of the clock signal frequency dividing circuit according to the second exemplary embodiment of the present invention.

In this case, a clock B corresponding to a frequency division ratio of 9/12 is generated from the clock S. Assume that the circuits A and B perform data communication at all the leading edges of the clock A, the clock A is synchronized with the clock S, and the frequency division ratio of the clock A is 1/3.

The phase signal 31 changes to "1" at the leading edge of the clock A, and "0" in the remaining period. The phase signal 31 indicates the phase of the clock A, i.e., the communication timing between the circuits A and B.

The counter 21 resets the count value at the timing when the phase signal 31 exhibits "1". Then, the counter 21 repetitively counts the clock pulses of the clock S in 12 cycles through which the phase relationship between the clocks A and B completes a cycle. As a result, the counter 21 outputs the count value 23 indicating the phase relationship between the clocks A and B.

In FIG. 4, timings when the count value 23 takes values "0" to "11" correspond to timings T0 to T11. That is, the count value 23 becomes "0" at timing T0, "1" at timing T1, "11" at timing T11, and again "0" at timing T0.

The table data 25 of the table circuit 22 is set to "0" when masking the pulse of the clock S in the next cycle, and "1" when not masking it for each combination 24 of the count value 23, frequency signal 32, frequency division ratio denominator M (41), and frequency division ratio numerator N (42). The value of the table data 25 corresponding to the combination 24 of the count value 23, frequency signal 32, frequency division ratio denominator M (41), and frequency division ratio numerator N (42), which is input at each time, is output as the mask signal 50.

In FIG. 4, the table circuit 22 holds in advance the table data 25 which assigns mask timings to combinations 24 corresponding to timings T2, T5, and T8 other than the communication timings of data communication between the circuits A and B, out of combinations 24 corresponding to timings T0 to T11 of M successive clock pulses of the clock signal S. No-mask timings are assigned to combinations 24 corresponding to the remaining timings T0, T1, T3, T4, T6, T7, T9, T10, and T11.

The table circuit 22 outputs, as the mask signal 50, "0" table data 25 indicating a no-mask timing when, for example, the count value 23 is "2", "5", and "8", and "1" table data 25 indicating a mask timing when the count value 23 takes another value.

By referring to the mask signal 50, the mask circuit 10 masks the pulses of the clock S at timings T2, T5, and T8, and outputs them as the clock B without masking them at the remaining timings.

At timings T0, T3, T6, and T9 out of timings T0 to T11 of M successive clock pulses, the clock pulse of the clock S is always output as the clock B without being masked. At timings other than the communication timings, i.e., timings T2, T5, and T8, the clock pulse is masked and is not output as the clock B.

In the generation example shown in FIG. 4, the frequency division ratio of the clock B is 9/12, the frequency of the clock A is 1/3 of that of the clock S, and communication is done at all the leading edges of the clock A. However, the above description also applies to other cases. In this case, the value of the table data 25 is appropriately set for each combination of the communication timing information 30, the frequency division ratio setting information 40, and the phase relationship between the clocks A and B. Clock pulses at the communication timings are always not masked, and clock pulses at timings other than the communication timings are masked, implementing arbitrary rational number frequency division.

In FIG. 4, the frequency division ratio denominator M, frequency division ratio numerator N, frequency signal 32, phase signal 31, and the like, which are input to the mask control circuit 20, have constant values. However, these values can also be properly changed during the operation as long as the table circuit 22 holds table data 25 corresponding to these values.

Figure 5:
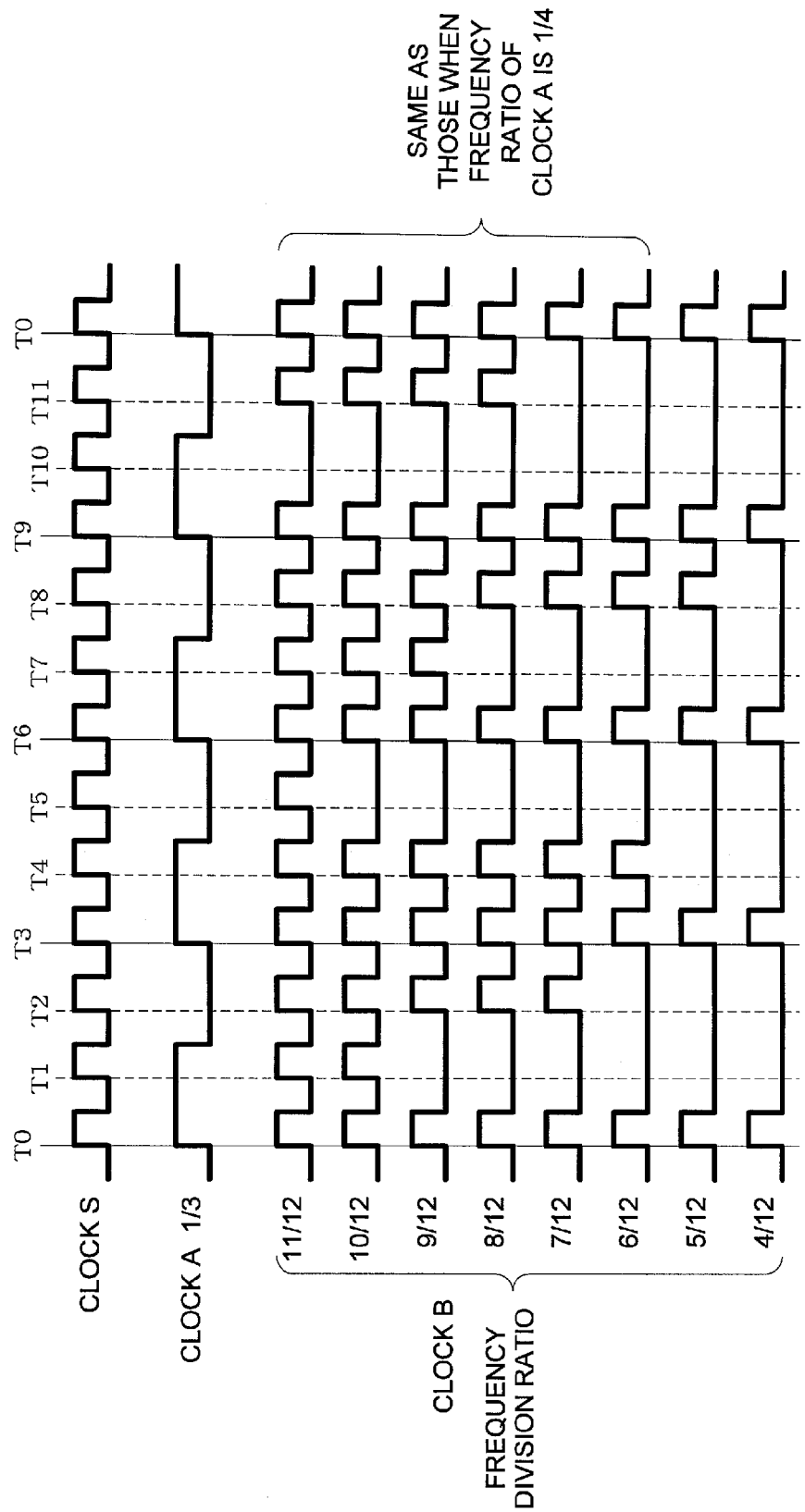
FIG. 5 is a timing chart showing another operation of the clock signal frequency dividing circuit according to the second exemplary embodiment of the present invention.
Figure 6:
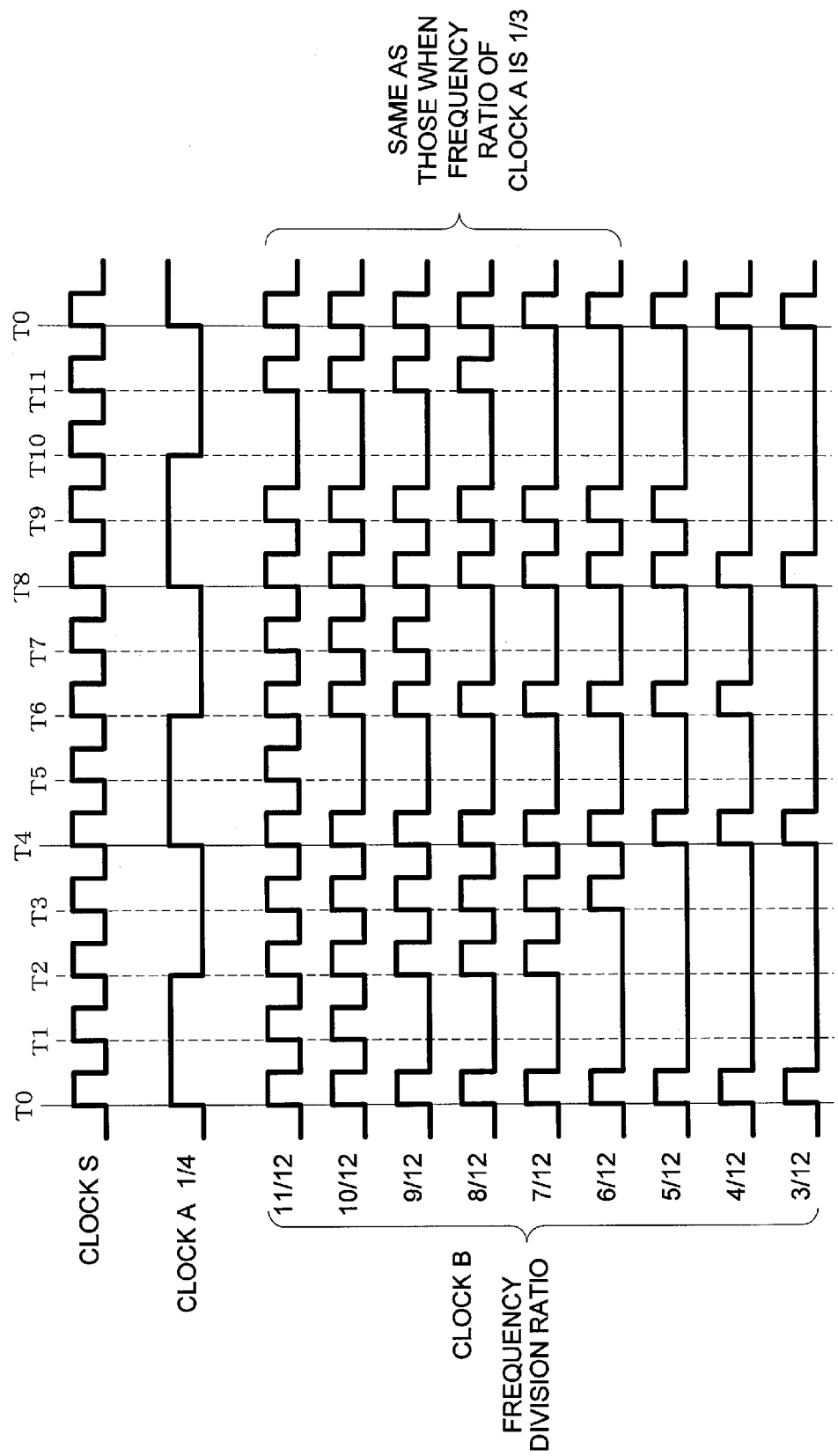
FIG. 6 is a timing chart showing still another operation of the clock signal frequency dividing circuit according to the second exemplary embodiment of the present invention.

The timing to mask the clock pulse of the clock S is arbitrary except for the communication timing. FIGS. 5 and 6 are timing charts each showing another operation of the clock signal frequency dividing circuit according to the second exemplary embodiment of the present invention.

FIG. 5 shows another generation example of clocks B generated by dividing the frequency of the clock S at frequency division ratios of 11/12 to 4/12 under the same condition as those in FIG. 2, i.e., when the frequency of the clock A is 1/3 of that of the clock S and communication is done at all the leading edges of the clock A. Pulses at timings different from those in the generation example of FIG. 2 are masked, out of pulses at timings T1, T2, T4, T5, T7, T8, T10, and T11 other than the communication timings.

FIG. 6 shows still another generation example of clocks B generated by dividing the frequency of the clock S at frequency division ratios of 11/12 to 3/12 when the frequency of the clock A is 1/4 of that of the clock S and communication is done at all the leading edges of the clock A. The generation example of FIG. 5 and that of FIG. 6 are different in the frequency of the clock A and as a result, different in the communication timing. However, these generation examples have a feature of generating clocks B at frequency division ratios of 11/12 to 6/12 by masking pulses at the same timings. For this reason, table data 25 for generating clocks B at frequency division ratios of 11/12 to 6/12 can be shared between a case in which the frequency of the clock A is 1/3 of that of the clock S and a case in which it is 1/4. This can reduce the hardware size of the table circuit 22.

Effects of Second Exemplary Embodiment

As described above, in the second exemplary embodiment, the mask control circuit counts the clock pulses of an input clock signal using the counter. When the count value reaches the frequency division ratio denominator M, the mask control circuit resets the count value, generating a count value indicating a relative phase at the communication timing with respect to the input clock signal. Based on the count value, the mask control circuit generates a mask signal which assigns mask timings. By using the counter which is a very simple circuit arrangement, a relative phase at the communication timing with respect to the input clock signal can be derived. The mask timing can be accurately assigned among timings other than the communication timings.

In the second exemplary embodiment, the mask control circuit holds in advance, in the table circuit, table data representing whether masking is necessary, for each combination of at least the communication timing information, frequency division ratio setting, and count value. The mask control circuit outputs, as a mask signal, the table data output from the table circuit in accordance with the input combination. By using the table circuit which is a very simple circuit arrangement, a desired mask timing corresponding to a relative phase at the communication timing with respect to the input clock signal can be accurately assigned among timings other than the communication timings.

In the second exemplary embodiment, the frequency division ratio setting of the clock B that is input to the mask control circuit 20 is given by the frequency division ratio denominator M indicating the denominator value of the frequency division ratio, and the frequency division ratio numerator N indicating the numerator value of the frequency division ratio. However, the frequency division ratio setting may take another form as long as the frequency division ratio of the clock B can be set. Similarly, communication timing information input to the mask control circuit 20 is made up of the frequency signal 32 indicating the frequency of the clock A serving as a communication target clock, and the phase signal 31 indicating the phase of the clock A. However, the communication timing information may take another form as long as the communication timing can be designated. Signals unnecessary for setting the frequency division ratio and designating the communication timing may be omitted properly. For example, when the clock A has only a specific frequency, the table data 25 need not be prepared for each frequency of the clock A, so the frequency signal 32 can be omitted.

The clock signal frequency dividing circuit 100 according to the second exemplary embodiment is formed from only a digital logical circuit, and implements rational number frequency division by selecting whether or not to mask the clock S. The clock signal frequency dividing circuit 100 has a feature of low power consumption and small layout area. Since the clock signal frequency dividing circuit 100 uses neither an analog circuit nor a circuit requiring a dedicated design, the design/verification cost becomes low.

Third Exemplary Embodiment

Figure 7:
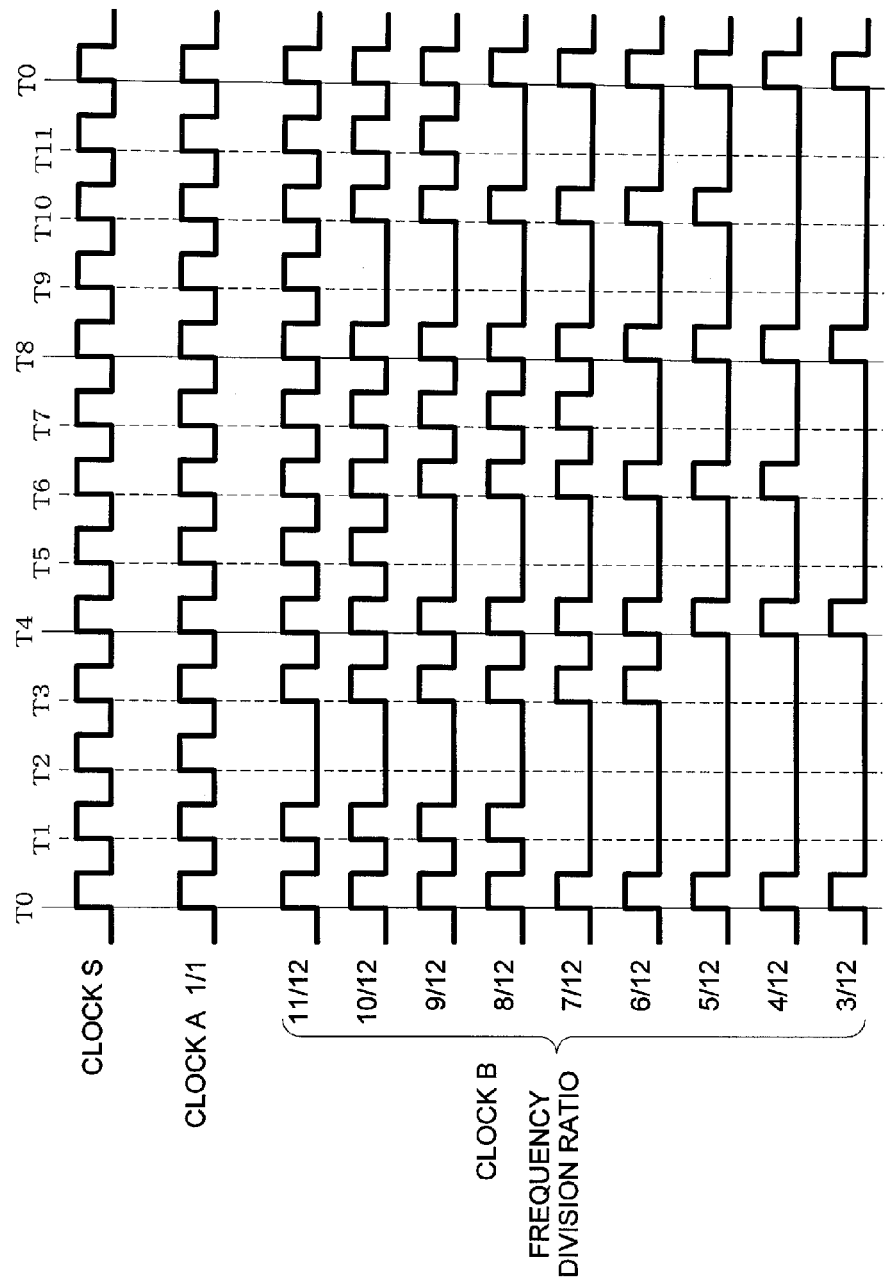
FIG. 7 is a timing chart showing the operation of a clock signal frequency dividing circuit according to the third exemplary embodiment of the present invention.

A clock signal frequency dividing circuit according to the third exemplary embodiment of the present invention will be described with reference to FIG. 7. FIG. 7 is a timing chart showing the operation of the clock signal frequency dividing circuit according to the third exemplary embodiment of the present invention.

In the first exemplary embodiment, the circuits A and B communicate with each other at all the leading edges of the clock A. However, the present invention is not limited to this, and the circuits A and B may communicate with each other at some leading edges of the clock A. In the third exemplary embodiment, circuits A and B communicate with each other at some of the leading edges of a communication target clock. The arrangement of the clock signal frequency dividing circuit according to the third exemplary embodiment is the same as that according to the first exemplary embodiment except for an input signal, and a detailed description thereof will not be repeated.

In the example of FIG. 7, the frequency of a clock A is the same as that of a clock S, and the circuits A and B communicate with each other at timings T0, T4, and T8 out of the leading edges of the clock A.

In this frequency division example as well, a clock signal frequency dividing circuit 100 receives communication timing information 30 indicating the communication timings of the circuits A and B. Based on the communication timing information 30, clock pulses at the communication timings are always not masked, and clock pulses at timings other than the communication timings are masked, implementing arbitrary rational number frequency division. More specifically, clock pulses at timings T0, T4, and T8 which are communication timings are always not masked, and clock pulses at some of timings T1, T2, T3, T5, T6, T7, T9, T10, and T11 which are not communication timings are masked, generating a clock B.

Effects of Third Exemplary Embodiment

As described above, according to the third exemplary embodiment, the clock B generated by the clock signal frequency dividing circuit 100 always has clock pulses at the communication timings of the circuits A and B. This obviates the need for a special clock converter and special timing design in order to implement an expected correct communication operation in communication using clocks having different frequencies. Consequently, efficient communication can be achieved without degrading the communication performance even in communication using clocks having different frequencies. Even when the frequency division ratio is changed, the timing of communication using clocks having different frequencies need not be changed in accordance with the changed frequency division ratio. In the clock frequency division example of FIG. 7, even if the frequency division ratio of the clock B is changed to one of 11/12 to 3/12, none of communication timings T0, T4, and T8 need be changed, and the changed frequency division ratio can be flexibly coped with.

Fourth Exemplary Embodiment

Figure 8:
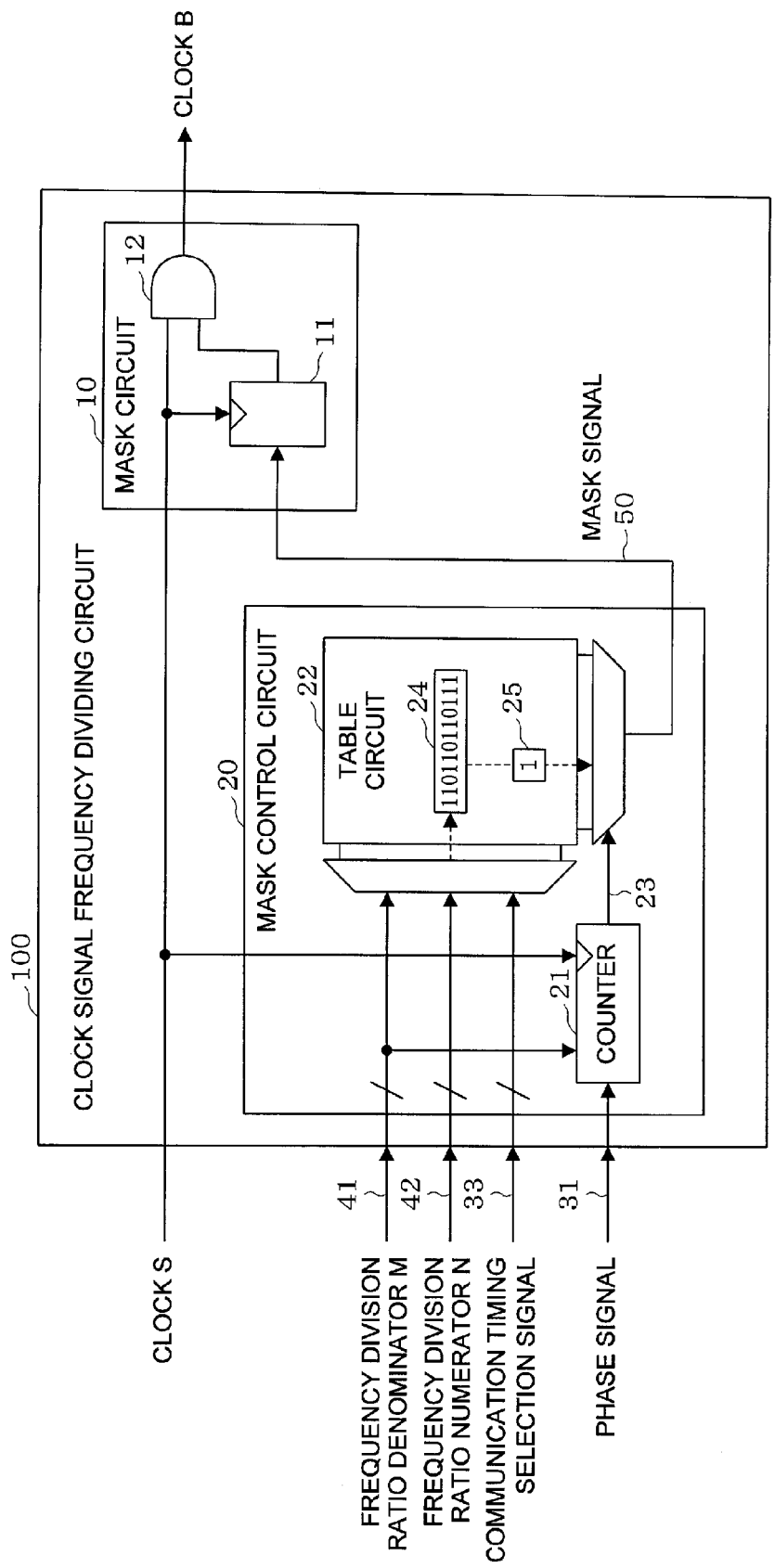
FIG. 8 is a block diagram showing the arrangement of a clock signal frequency dividing circuit according to the fourth exemplary embodiment of the present invention.

A clock signal frequency dividing circuit according to the fourth exemplary embodiment of the present invention will be described with reference to FIG. 8. FIG. 8 is a block diagram showing the arrangement of the clock signal frequency dividing circuit according to the fourth exemplary embodiment of the present invention. The same reference numerals as those in FIG. 3 denote the same or similar parts.

The fourth exemplary embodiment will explain a practical example of the mask control circuit 20 in the clock signal frequency dividing circuit 100 according to the third exemplary embodiment. A clock signal frequency dividing circuit 100 according to the fourth exemplary embodiment is different from that according to the second exemplary embodiment in the arrangement of the table circuit 22 in the mask control circuit 20. The remaining arrangement is the same as that in FIG. 3, and a detailed description thereof will not be repeated.

A table circuit 22 has a function of holding in advance, in a table form, table data 25 representing whether masking is necessary, for each combination 24 of a count value 23, a communication timing selection signal 33 serving as communication timing information 30, and a frequency division ratio denominator M (41) and frequency division ratio numerator N (42) serving as frequency division ratio setting information 40. A table circuit 22 also has a function of outputting, as a mask signal 50, the table data 25 corresponding to a combination of these input values. In accordance with the frequency division ratio denominator M, frequency division ratio numerator N, communication timing selection signal 33, and count value 23, the table circuit 22 outputs the mask signal 50 for each clock pulse of the clock S to control whether to mask the clock pulse of the clock S by a mask circuit 10.

The fourth exemplary embodiment is different from the second exemplary embodiment in that the communication timing selection signal 33 is used as the communication timing information 30, instead of the frequency signal 32. The communication timing selection signal 33 is a signal for selecting a communication timing in a circuit A from timings in a period through which the phase relationship between a clock A used for a communication operation in the circuit A and a clock B in a circuit B completes a cycle. The communication timing selection signal 33 is formed from parallel bit data of a plurality of bits.

Operation in Fourth Exemplary Embodiment

Figure 9:
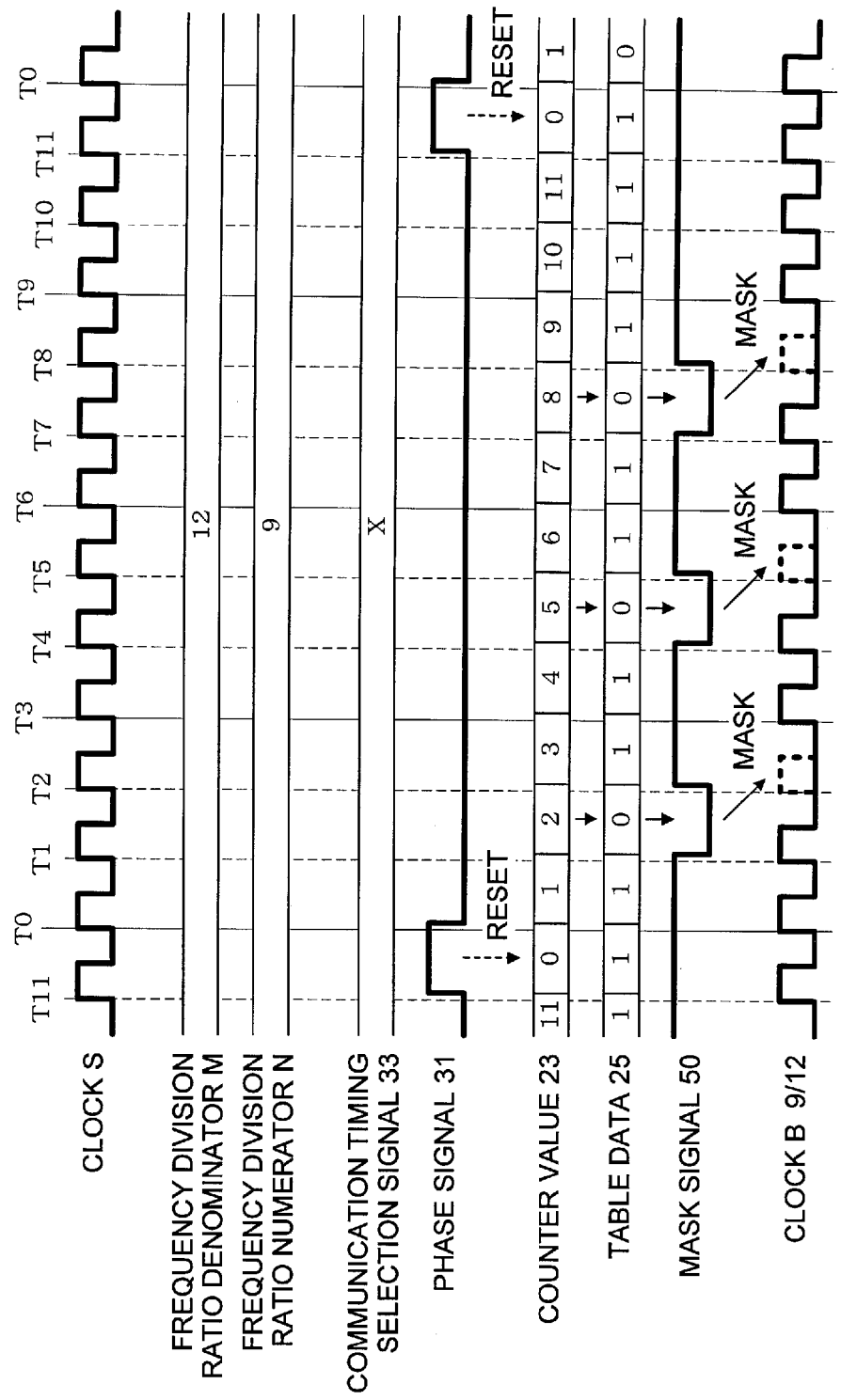
FIG. 9 is a timing chart showing the operation of the clock signal frequency dividing circuit according to the fourth exemplary embodiment of the present invention.

The operation of the clock signal frequency dividing circuit according to the fourth exemplary embodiment of the present invention will be described with reference to FIG. 9. FIG. 9 is a timing chart showing the operation of the clock signal frequency dividing circuit according to the fourth exemplary embodiment of the present invention.

In this case, a clock B corresponding to a frequency division ratio of 9/12 is generated from the clock S. Assume that the circuits A and B communicate with each other at timings T0, T3, T6, and T9, the clock A is synchronized with the clock S, and the frequency division ratio of the clock A is 7/12.

A phase signal 31 changes to "1" in an arbitrary cycle in a period through which the phase relationship between the clocks A and B completes a cycle, and "0" in the remaining period. The operation in FIG. 9 is different from that in FIG. 4 in that the phase signal 31 becomes "1" in only one of 12 cycles through which the phase relationship completes a cycle.

A table circuit 22 outputs, as the mask signal 50, the value of table data 25 corresponding to the combination 24 of the count value 23, communication timing selection signal 33, frequency division ratio denominator M (41), and frequency division ratio numerator N (42) at each time.

The table circuit 22 outputs, as the mask signal 50, "0" when, for example, the count value 23 is "2", "5", and "8", and "1" when the count value 23 takes another value.

By referring to the mask signal 50, a mask circuit 10 masks the pulses of the clock S at timings T2, T5, and T8, and outputs them as the clock B without masking them at the remaining timings.

By appropriately setting the value of the table data 25, clock pulses at timings T0, T3, T6, and T9 which are the communication timings of the circuits A and B are always not masked, and clock pulses at timings other than the communication timings, e.g., T2, T5, and T8 are masked, generating a clock B corresponding to a frequency division ratio of 9/12 from the clock S.

In the example of FIG. 9, timings T0, T3, T6, and T9 are selected based on the communication timing selection signal 33 as communication timings in a period through which the phase relationship between the clocks A and B completes a cycle. By properly changing the communication timing selection signal 33, communication at another timing can also be selected. Even in this case, the value of the table data 25 is appropriately set for each communication timing selected by the communication timing selection signal 33. Clock pulses at the communication timings are always not masked, and clock pulses at timings other than the communication timings are masked, implementing arbitrary rational number frequency division.

First Example

Figure 10:
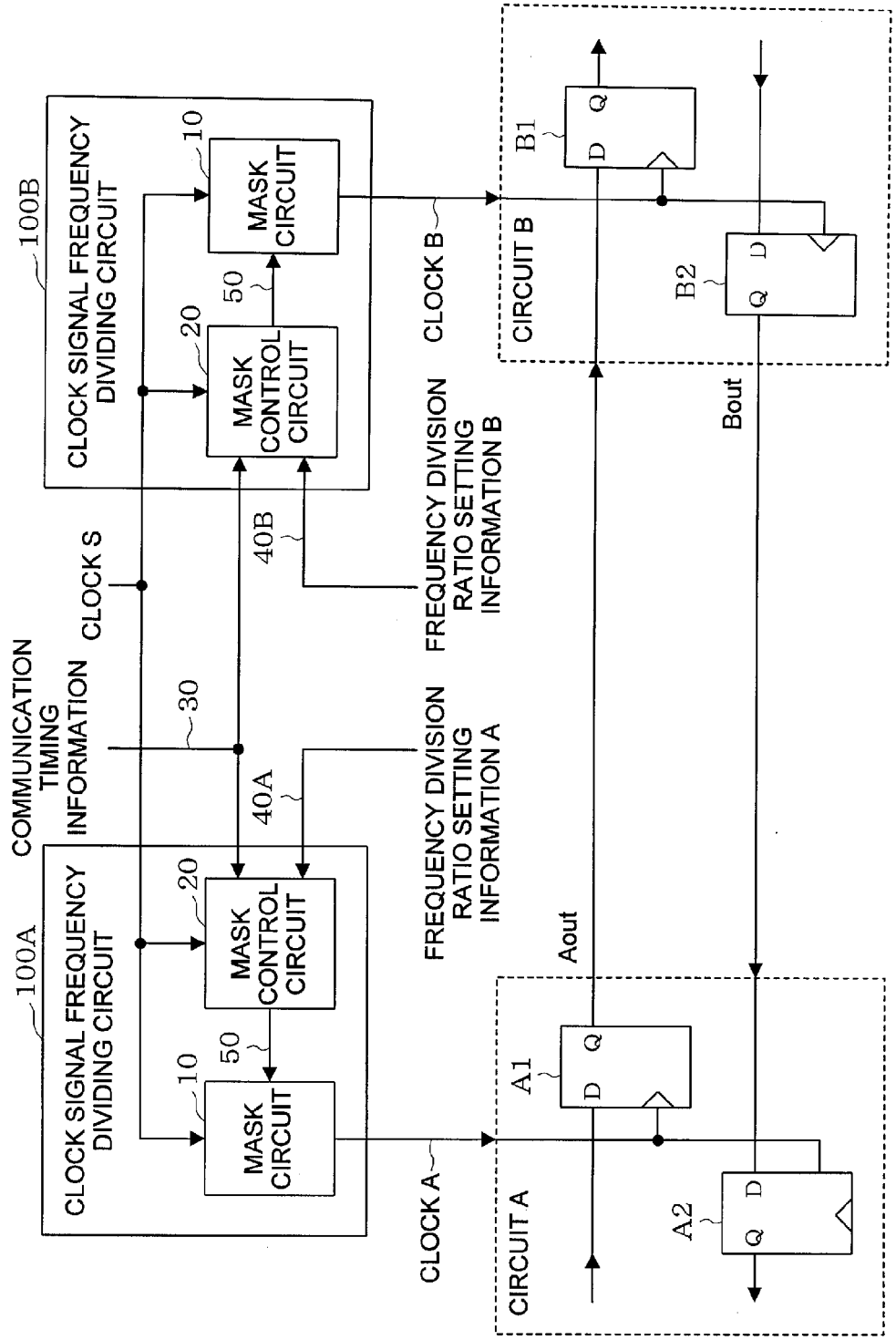
FIG. 10 is an explanatory block diagram showing an application example of a clock signal frequency dividing circuit according to the first example of the present invention.

The first example of the clock signal frequency dividing circuit according to each exemplary embodiment of the present invention will be explained with reference to FIG. 10. FIG. 10 is an explanatory block diagram showing an application example of the clock signal frequency dividing circuit according to the first example of the present invention.

In each exemplary embodiment of the present invention, the circuit A performs a data communication operation based on the clock A having a predetermined interval. However, the circuit A can also execute a data communication operation based on a clock A having a frequency divided by a rational number, similarly to the foregoing way.

FIG. 10 exemplifies a semiconductor integrated circuit including a circuit A which operates based on a clock A and a circuit B which operates based on a clock B. A clock signal frequency dividing circuit 100A identical to the clock signal frequency dividing circuit 100 is arranged for the circuit A. A clock signal frequency dividing circuit 100B identical to the clock signal frequency dividing circuit 100 is arranged for the circuit B.

The clock signal frequency dividing circuit 100B receives communication timing information 30 indicating communication timings between the clocks A and B, in addition to frequency division ratio setting information B (40B) for setting the frequency division ratio of the clock B. Based on the frequency division ratio setting information B (40B) and communication timing information 30, the clock signal frequency dividing circuit 100B divides the frequency of the clock S by a rational number, generating a clock B.

The clock signal frequency dividing circuit 100A receives the communication timing information 30, in addition to frequency division ratio setting information A (40A) for setting the frequency division ratio of the clock A. Based on the frequency division ratio setting information A (40A) and communication timing information 30, the clock signal frequency dividing circuit 100A divides the frequency of the clock S by a rational number, generating a clock A.

The circuits A and B communicate with each other using the signals Aout and Bout at the communication timings based on the communication timing information 30. In this example, the circuit A drives a latch circuit A1 at the leading edge of the clock A, outputting the signal Aout. The circuit B drives a latch circuit B1 at the leading edge of the clock B, receiving the signal Aout. Also, the circuit B drives a latch circuit B2 at the leading edge of the clock B, outputting the signal Bout. The circuit A drives a latch circuit A2 at the leading edge of the clock A, receiving the signal Bout.

The first example will be explained by exemplifying the first exemplary embodiment with reference to FIG. 11.

Figure 11:
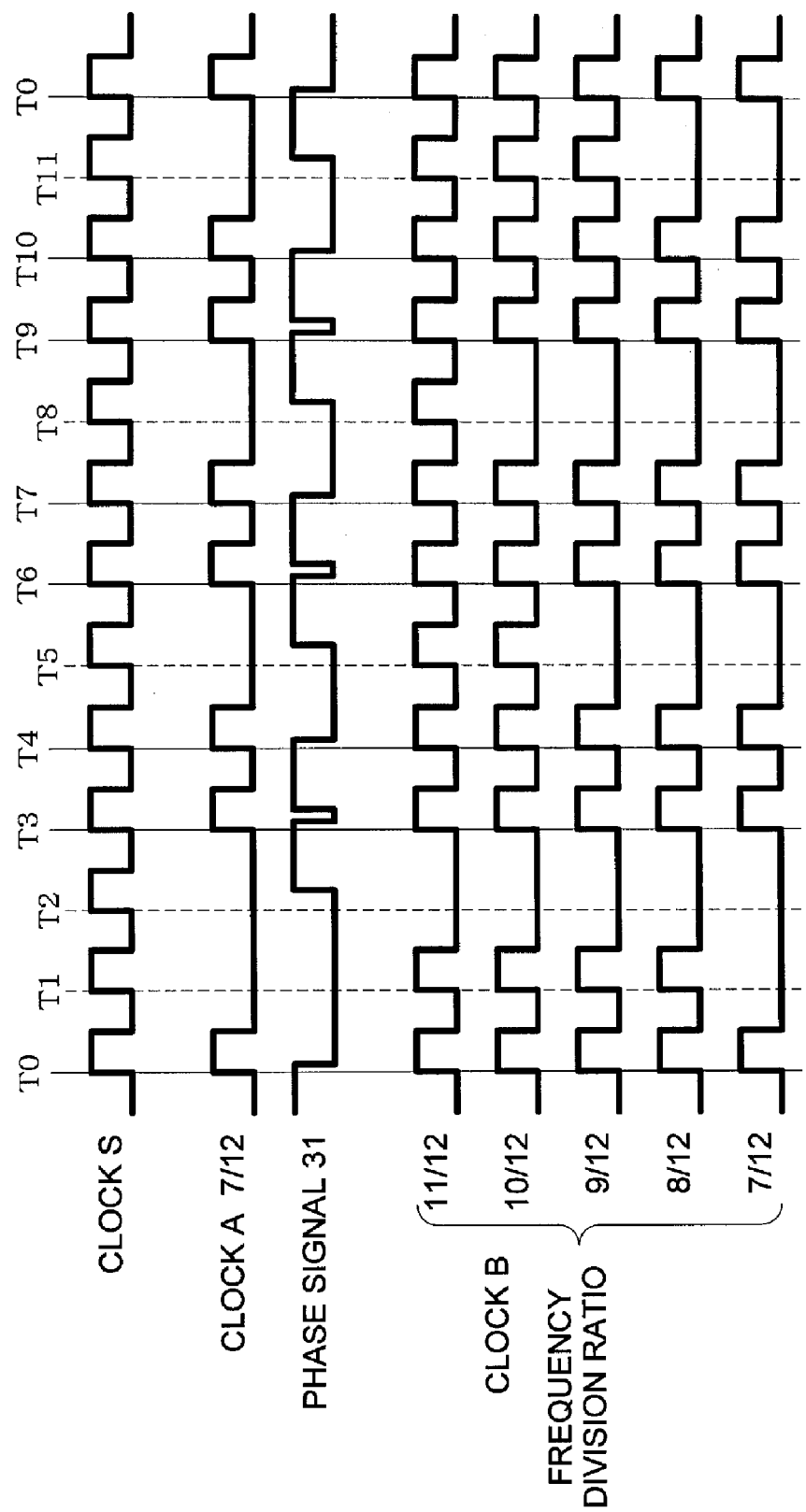
FIG. 11 is a timing chart showing the operation of the clock signal frequency dividing circuit according to the first example of the present invention.

FIG. 11 is a timing chart showing the operation of the clock signal frequency dividing circuit according to the first example of the present invention. In this example, the frequency of the clock S is divided at frequency division ratios of 11/12 to 7/12 to generate clocks B, and divided at a frequency division ratio of 7/12 to generate a clock A.

Since both the frequency division ratio denominators M of the clocks A and B with respect to the clock S are 12, the phase relationship between the clocks A and B completes a cycle through 12 cycles of the clock S. T0 to T11 indicate the timings of the 12 cycles through which the phase relationship completes a cycle. The circuits A and B communicate with each other at timings T0, T3, T4, T6, T7, T9, and T10 which correspond to all the leading edges of the clock A at the frequency division ratio of 7/12.

Mask control circuits 20 in the clock signal frequency dividing circuits 100A and 100B receive the communication timing information 30 indicating the communication timings. The mask control circuits 20 always do not mask clock pulses at the communication timings between the circuits A and B, and mask clock pulses at timings other than the communication timings.

In the example of FIG. 11, a phase signal 31, which is an example of the communication timing information 30, exhibits "1" at preceding and succeeding timings including timings T0, T3, T4, T6, T7, T9, and T10 which are communication timings.

The mask control circuit 20 generates a mask signal 50 which assigns mask timings to mask the clock pulses of the clock S, to timings other than the communication timings, i.e., timings when the phase signal 31 exhibits "0".

As a consequence, mask timings to mask (M−N) clock pulses are assigned to the leading edges of the clock pulses of the clock S in a period during which the phase signal 31 exhibits "0", i.e., some of timings T1, T2, T5, T8, and T11.

For example, when a mask timing is assigned to T2 among timings other than timings T0, T3, T4, T6, T7, T9, and T10 out of 12 clock pulses of the clock S at timings T0 to T11, a clock B corresponding to a frequency division ratio of 11/12 can be generated. By additionally assigning a mask timing to T8, a clock B corresponding to a frequency division ratio of 10/12 can be generated.

When mask timings are assigned to T2, T5, and T8 among timings other than T0, T3, T4, T6, T7, T9, and T10, a clock B corresponding to a frequency division ratio of 9/12 can be generated. By additionally assigning a mask timing to T11, a clock B corresponding to a frequency division ratio of 8/12 can be generated. Further, by additionally assigning a mask timing to T4, a clock B corresponding to a frequency division ratio of 7/12 can be generated.

Figure 12:
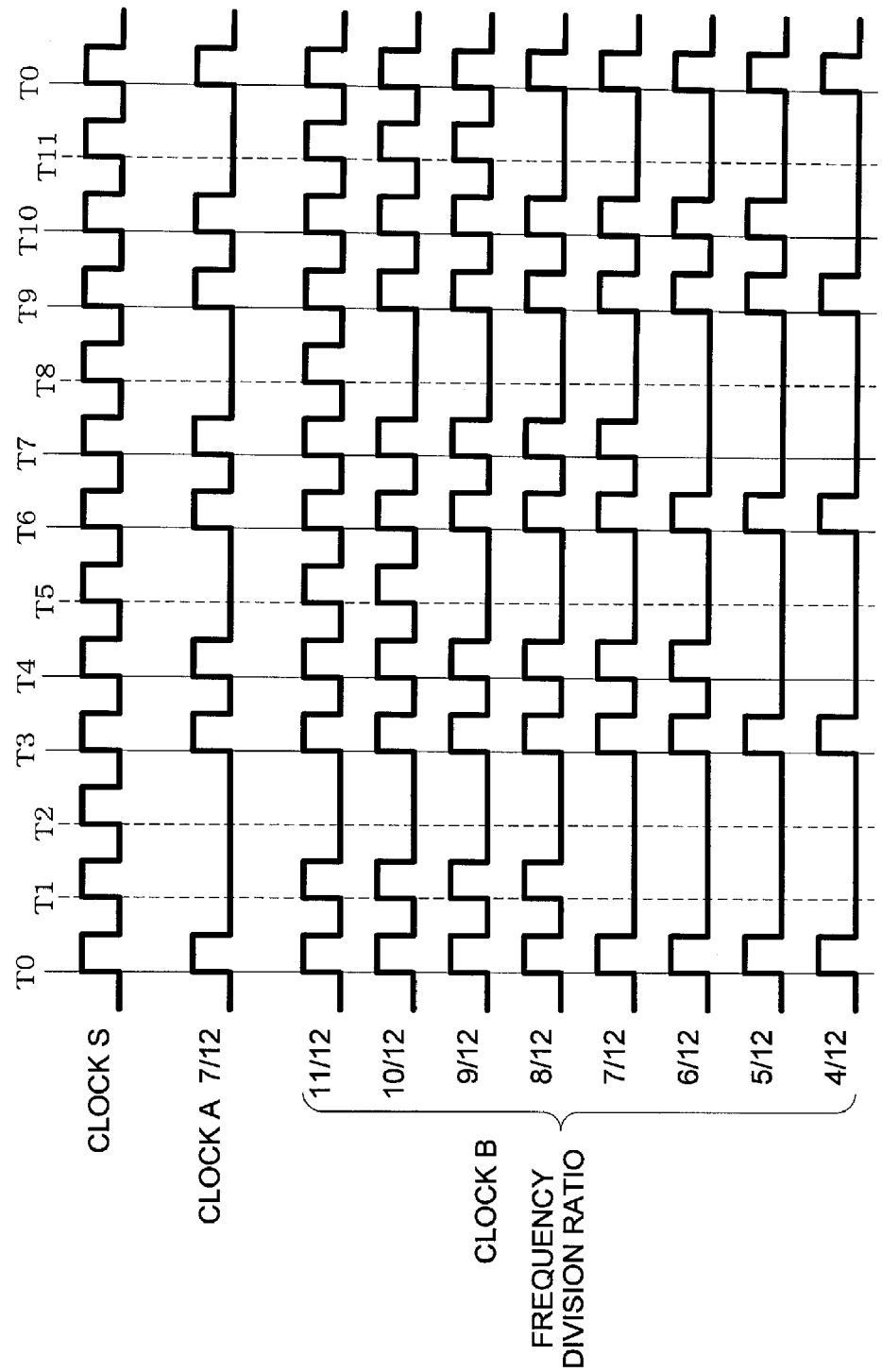
FIG. 12 is a timing chart showing another operation of the clock signal frequency dividing circuit according to the first example of the present invention.

Next, the first example will be explained by exemplifying the third exemplary embodiment with reference to FIG. 12. FIG. 12 is a timing chart showing another operation of the clock signal frequency dividing circuit according to the first example of the present invention.

FIG. 12 shows clocks B generated by dividing the frequency of the clock S at frequency division ratios of 11/12 to 7/12, and a clock A generated by dividing the frequency of the clock S at a frequency division ratio of 7/12. Assume that the circuits A and B communicate with each other at timings T0, T3, T6, and T9.

Also in this example, the clock signal frequency dividing circuits 100A and 100B receive the communication timing information 30 indicating the communication timings of the circuits A and B. Based on the communication timing information 30, clock pulses at the communication timings are always not masked, and clock pulses at timings other than the communication timings are masked, implementing rational number frequency division. More specifically, clock pulses at timings T0, T3, T6, and T9 which are communication timings are always not masked, and clock pulses at some of timings T1, T2, T4, T5, T7, T8, T10, and T11 which are not communication timings are masked, generating clocks A and B.

The first example can be applied in the above-described way not only to a case in which the circuit A performs a data communication operation based on a clock A having a predetermined interval, but also to a case in which it executes a data communication operation based on a clock A having a frequency divided by a rational number. The first example can obtain the same operation effects as those described above.

In the first example, application examples of the clock signal frequency dividing circuits according to the first and third exemplary embodiments have been described. However, the first example is also applicable to the clock signal frequency dividing circuits according to the second and fourth exemplary embodiments, and can obtain the same operation effects as those described above.

Second Example

Figure 13:
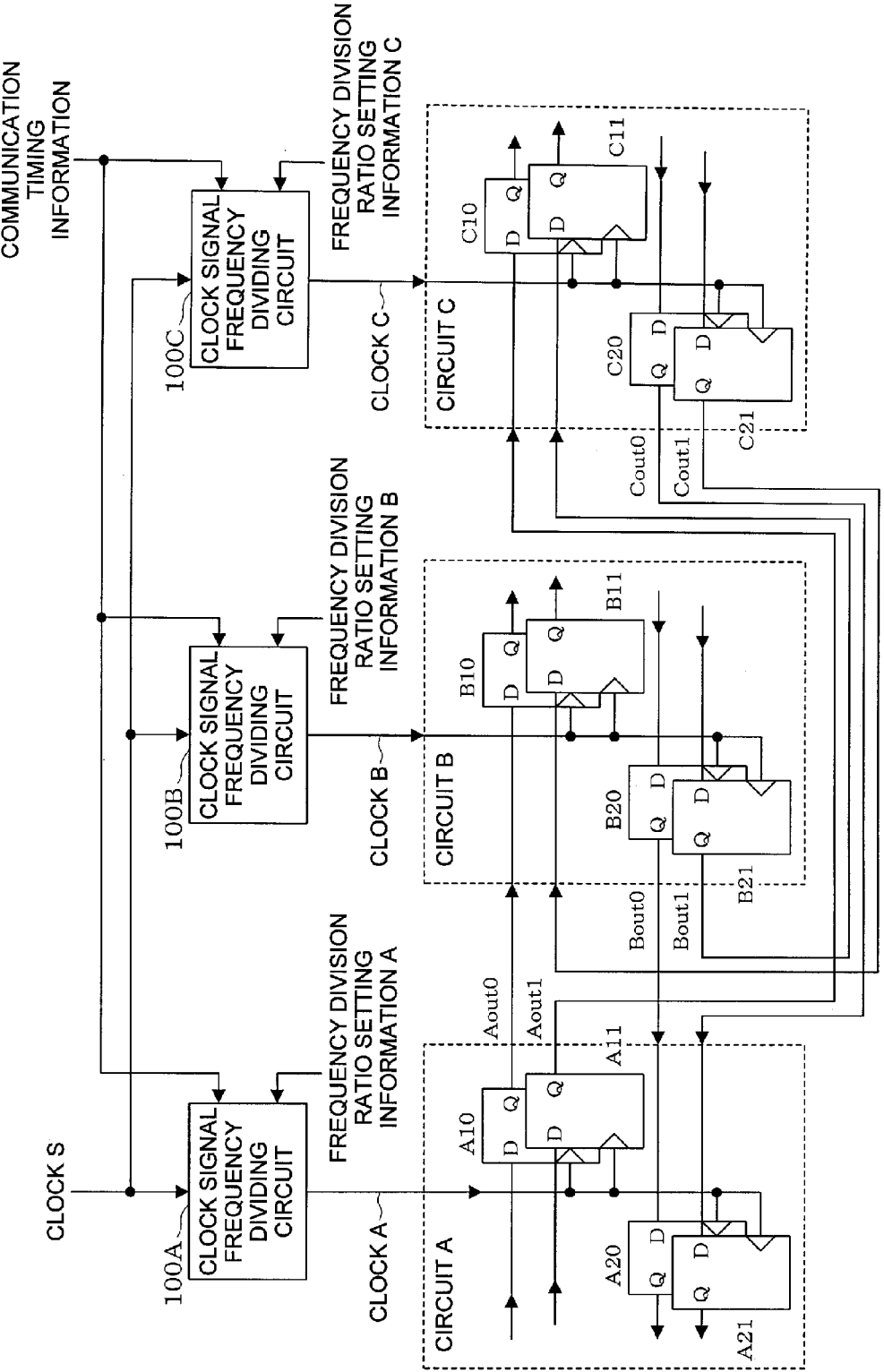
FIG. 13 is an explanatory block diagram showing an application example of a clock signal frequency dividing circuit according to the second example of the present invention.

The second example of the clock signal frequency dividing circuit according to each exemplary embodiment of the present invention will be explained with reference to FIG. 13. FIG. 13 is an explanatory block diagram showing an application example of the clock signal frequency dividing circuit according to the second example of the present invention.

In the first example, two circuits, i.e., the circuit A which operates based on the clock A, and the circuit B which operates based on the clock B communicate with each other. In the second example, the numbers of clocks and circuits are three or more.

FIG. 13 exemplifies a semiconductor integrated circuit including three circuits, i.e., a circuit A which operates based on a clock A, a circuit B which operates based on a clock B, and a circuit C which operates based on a clock C. A clock signal frequency dividing circuit 100A identical to the clock signal frequency dividing circuit 100 is arranged for the circuit A. A clock signal frequency dividing circuit 100B identical to the clock signal frequency dividing circuit 100 is arranged for the circuit B. A clock signal frequency dividing circuit 100C identical to the clock signal frequency dividing circuit 100 is arranged for the circuit C.

The clock signal frequency dividing circuit 100A receives communication timing information indicating communication timings between the clocks A, B, and C, in addition to a frequency division ratio setting A for setting the frequency division ratio of the clock A. Based on the frequency division ratio setting A and communication timing information, the clock signal frequency dividing circuit 100A divides the frequency of the clock S by a rational number, generating a clock A. Similarly, the clock signal frequency dividing circuit 100B receives communication timing information indicating the communication timings, in addition to a frequency division ratio setting B for setting the frequency division ratio of the clock B. Based on the frequency division ratio setting B and communication timing information, the clock signal frequency dividing circuit 100B divides the frequency of the clock S by a rational number, generating a clock B. Also, the clock signal frequency dividing circuit 100C receives communication timing information indicating the communication timings, in addition to a frequency division ratio setting C for setting the frequency division ratio of the clock C. Based on the frequency division ratio setting C and communication timing information, the clock signal frequency dividing circuit 100C divides the frequency of the clock S by a rational number, generating a clock C.

The circuits A, B, and C communicate with each other at the communication timings based on communication timing information 30. Of the circuits A, B, and C, the circuits A and B communicate with each other using signals Aout0 and Bout0. At this time, the circuit A drives a latch circuit A10 at the leading edge of the clock A, outputting the signal Aout0. The circuit B drives a latch circuit B10 at the leading edge of the clock B, receiving the signal Aout0. Also, the circuit B drives a latch circuit B20 at the leading edge of the clock B, outputting the signal Bout0. The circuit A drives a latch circuit A20 at the leading edge of the clock A, receiving the signal Bout0.

The circuits A and C communicate with each other using signals Aout1 and Cout0. At this time, the circuit A drives a latch circuit A11 at the leading edge of the clock A, outputting the signal Aout1. The circuit C drives a latch circuit C10 at the leading edge of the clock C, receiving the signal Aout1. Also, the circuit C drives a latch circuit C20 at the leading edge of the clock C, outputting the signal Cout0. The circuit A drives a latch circuit A21 at the leading edge of the clock A, receiving the signal Cout0.

The circuits B and C communicate with each other using signals Bout1 and Cout1. At this time, the circuit B drives a latch circuit B11 at the leading edge of the clock B, outputting the signal Bout1. The circuit C drives a latch circuit C11 at the leading edge of the clock C, receiving the signal Bout1. Also, the circuit C drives a latch circuit C21 at the leading edge of the clock C, outputting the signal Cout1. The circuit B drives a latch circuit B21 at the leading edge of the clock B, receiving the signal Cout1.

Figure 14:
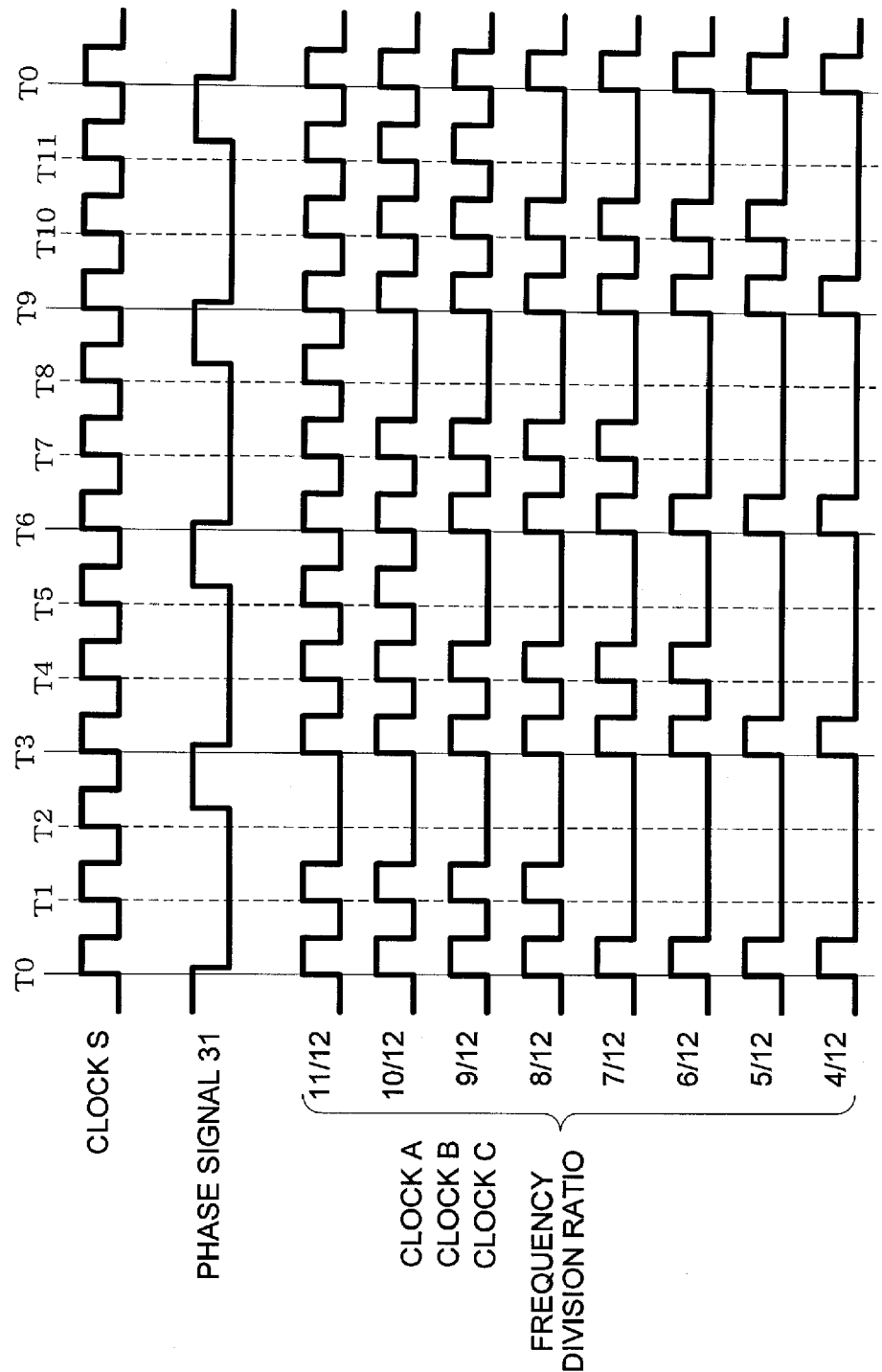
FIG. 14 is a timing chart showing the operation of the clock signal frequency dividing circuit according to the second example of the present invention.
Figure 15:
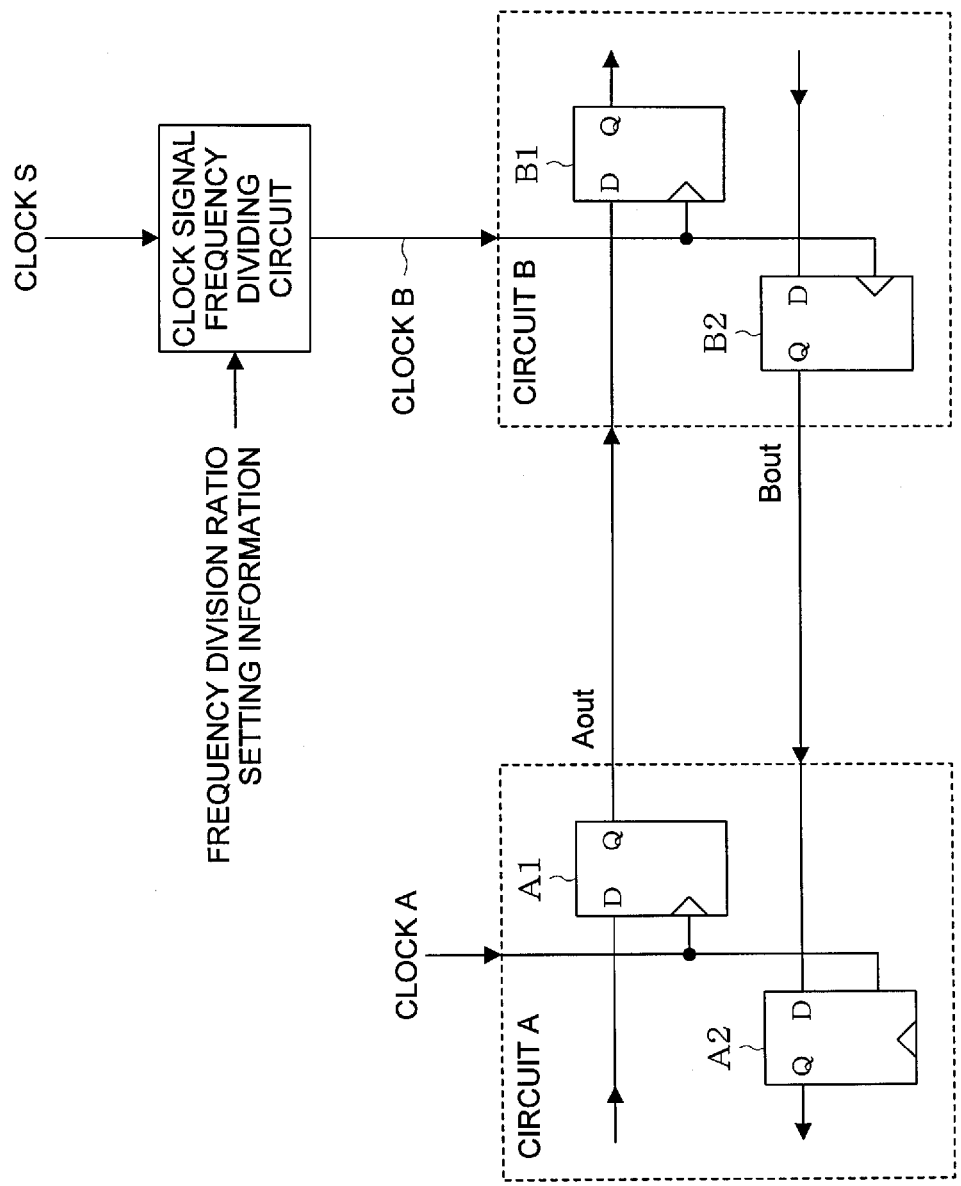
FIG. 15 exemplifies a semiconductor integrated circuit using a clock signal frequency dividing circuit of a related art.

FIG. 14 is a timing chart showing the operation of the clock signal frequency dividing circuit according to the second example of the present invention. In this example, the frequency of the clock S is divided at frequency division ratios of 11/12 to 4/12, generating clocks A, B, and C. The circuits A, B, and C communicate with each other at timings T0, T3, T6, and T9.

In this example as well, the clock signal frequency dividing circuits 100A, 100B, and 100C according to the present invention receive communication timing information indicating the communication timings. Based on the communication timing information, clock pulses at timings other than the communication timings are always not masked, and clock pulses at the remaining timings are masked, implementing rational number frequency division. More specifically, clock pulses at timings T0, T3, T6, and T9 which are communication timings are always not masked, and clock pulses at some of timings T1, T2, T4, T5, T7, T8, T10, and T11 which are not communication timings are masked, generating clocks A, B, and C.

Also in the second example, a clock generated by the clock signal frequency dividing circuit always has clock pulses at the communication timings. This obviates the need for a special clock converter and special timing design in order to implement an expected correct communication operation in communication using clocks having different frequencies. Thus, efficient communication can be achieved without degrading the communication performance even in communication using clocks having different frequencies. Even when the frequency division ratio is changed, the timing of communication using clocks having different frequencies need not be changed in accordance with the changed frequency division ratio. In the clock frequency division example of FIG. 14, even when the frequency division ratios of the clocks A, B, and C are changed to some of 11/12 to 4/12, none of communication timings T0, T3, T6, and T9 need be changed, and the changed frequency division ratios can be flexibly coped with.

In the second example, an application example of the clock signal frequency dividing circuit according to the first exemplary embodiment has been described. However, the second example is also applicable to the clock signal frequency dividing circuits according to the second to fourth exemplary embodiments, and can obtain the same operation effects as those described above.

INDUSTRIAL APPLICABILITY

The clock signal frequency dividing circuit according to the present invention can be applied as a clock signal frequency dividing circuit which divides the frequency of a received reference clock signal to generate a data communication clock signal in a general communication device. The clock signal frequency dividing circuit according to the present invention is optimum especially for a communication device which performs data communication with a partner circuit that operates based on a clock signal different in frequency from an input clock signal.

The invention claimed is:

1. A clock signal frequency dividing circuit which generates an output clock signal used in a target circuit that communicates with a partner circuit using a clock signal different in frequency from an input clock signal, by masking (M−N) clock pulses out of M successive clock pulses of the input clock signal based on a frequency division ratio defined by N/M (N is a positive integer and M is a positive integer larger than N) to divide a frequency of the input clock signal at N/M, comprising:

a mask circuit which masks clock pulses of the input clock signal in accordance with an input mask signal, generating and outputting the output clock signal; and a mask control circuit which generates a mask signal that assigns mask timings to mask (M−N) clock pulses, to timings other than communication timings, out of timings of M successive clock pulses of the input clock signal, based on communication timing information indicating communication timings of data communication performed by the target circuit.

2. A clock signal frequency dividing circuit according to claim 1, wherein said mask control circuit counts clock pulses of the input clock signal using a counter, and when a count value reaches a frequency division ratio denominator M, resets the count value to generate a count value indicating a relative phase at the communication timing with respect to the input clock signal, and generates the mask signal based on the count value.

3. A clock signal frequency dividing circuit according to claim 2, wherein said mask control circuit holds in advance, in a table circuit, table data representing whether masking is necessary, for each combination of at least the communication timing information and the count value, and outputs, as the mask signal, table data which is output from the table circuit in accordance with an input combination.

4. A clock signal frequency dividing circuit according to claim 3, wherein the table circuit holds in advance table data representing whether masking is necessary, for each combination of the frequency division ratio denominator M and a frequency division ratio numerator N in addition to the communication timing information and the count value.

5. A clock signal frequency dividing circuit according to claim 1, wherein the communication timing information includes a phase signal indicating a phase at the communication timing in the partner circuit which performs data communication with the target circuit.

6. A clock signal frequency dividing circuit according to claim 5, wherein the communication timing information further includes a frequency signal indicating a frequency of a partner clock signal used in a communication operation in the partner circuit.

7. A clock signal frequency dividing circuit according to claim 5, wherein the communication timing information further includes communication timing selection information for selecting a communication timing in the partner circuit from timings in a period through which a phase relationship between a partner clock signal used in a communication operation in the partner circuit, and the output clock signal completes a cycle.

8. A clock signal frequency dividing circuit according to claim 5, wherein said mask control circuit counts clock pulses of the input clock signal using a counter, and when a count value reaches a frequency division ratio denominator M, resets the count value to generate a count value indicating a relative phase at the communication timing with respect to the input clock signal, and generates the mask signal based on the count value.

9. A clock signal frequency dividing method of generating an output clock signal used in a target circuit that communicates with a partner circuit using a clock signal different in frequency from an input clock signal, by dividing a frequency of the input clock signal at N/M based on a frequency division ratio defined by N/M (N is a positive integer and M is a positive integer larger than N), comprising:

generating a mask signal that assigns mask timings to mask (M−N) clock pulses, to timings other than communication timings, out of timings of M successive clock pulses of the input clock signal, based on communication timing information indicating communication timings of data communication performed by the target circuit; and generating and outputting the output clock signal by masking clock pulses of the input clock signal at the mask timings of the mask signal without masking clock pulses of the input clock signal at timings other than the mask timings.

10. A clock signal frequency dividing method according to claim 9, wherein when generating and outputting the output clock signal, clock pulses of the input clock signal are counted using a counter, and when a count value reaches a frequency division ratio denominator M, the count value is reset to generate a count value indicating a relative phase at the communication timing with respect to the input clock signal, and the mask signal is generated based on the count value.

11. A clock signal frequency dividing method according to claim 10, wherein when generating and outputting the output clock signal, table data representing whether masking is necessary is held in advance in a table circuit for each combination of at least the communication timing information and the count value, and table data which is output from the table circuit in accordance with an input combination is output as the mask signal.

12. A clock signal frequency dividing method according to claim 11, wherein the table circuit holds in advance table data representing whether masking is necessary, for each combination of the frequency division ratio denominator M and a frequency division ratio numerator N in addition to the communication timing information and the count value.

13. A clock signal frequency dividing method according to claim 9, wherein the communication timing information includes a phase signal indicating a phase at the communication timing in the partner circuit.

14. A clock signal frequency dividing method according to claim 13, wherein the communication timing information further includes a frequency signal indicating a frequency of a partner clock signal used in a communication operation in the partner circuit.

15. A clock signal frequency dividing method according to claim 13, wherein the communication timing information further includes communication timing selection information for selecting a communication timing in the partner circuit from timings in a period through which a phase relationship between a partner clock signal used in a communication operation in the partner circuit, and the output clock signal completes a cycle.

16. A clock signal frequency dividing method according to claim 13, wherein when generating and outputting the output clock signal, clock pulses of the input clock signal are counted using a counter, and when a count value reaches a frequency division ratio denominator M, the count value is reset to generate a count value indicating a relative phase at the communication timing with respect to the input clock signal, and the mask signal is generated based on the count value.

* * * * *